US 9,244,099 B2

(12) United States Patent
Duckworth et al.

(10) Patent No.: US 9,244,099 B2
(45) Date of Patent: Jan. 26, 2016

(54) PROBE HEAD ASSEMBLIES, COMPONENTS THEREOF, TEST SYSTEMS INCLUDING THE SAME, AND METHODS OF OPERATING THE SAME

(75) Inventors: Koby Duckworth, Newberg, OR (US); Eric Hill, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 717 days.

(21) Appl. No.: 13/463,712

(22) Filed: May 3, 2012

(65) Prior Publication Data
US 2012/0286817 A1   Nov. 15, 2012

Related U.S. Application Data

(60) Provisional application No. 61/484,116, filed on May 9, 2011.

(51) Int. Cl.
*G01R 1/067*   (2006.01)
*G01R 1/073*   (2006.01)
*G01R 31/28*   (2006.01)

(52) U.S. Cl.
CPC ........ *G01R 1/06738* (2013.01); *G01R 1/07378* (2013.01); *G01R 31/2889* (2013.01)

(58) Field of Classification Search
CPC ........... G01R 1/06738; G01R 1/07378; G01R 31/2889
USPC .................................................... 324/755.01
See application file for complete search history.

(56) References Cited

U.S. PATENT DOCUMENTS

| | | | |
|---|---|---|---|
| 3,781,681 A | 12/1973 | Wagner et al. | |
| 4,001,685 A | 1/1977 | Roch | |
| 5,101,453 A | 3/1992 | Rumbaugh | |
| 5,507,652 A | 4/1996 | Wardwell | |
| 5,529,504 A * | 6/1996 | Greenstein | G01R 1/0735 29/831 |
| 5,914,613 A * | 6/1999 | Gleason | G01R 1/06711 324/750.24 |

(Continued)

FOREIGN PATENT DOCUMENTS

| | | |
|---|---|---|
| EP | 0298219 A2 | 1/1989 |
| JP | 2004-171905 | 6/2004 |
| WO | WO 2012/061568 | 5/2012 |

OTHER PUBLICATIONS

English-language abstract of Japanese Patent Publication No. JP 2004-171905 published Jun. 17, 2004.

*Primary Examiner* — Benjamin M Baldridge
(74) *Attorney, Agent, or Firm* — Dascenzo Intellectual Property Law, P.C.

(57) ABSTRACT

Probe head assemblies, components of probe head assemblies, test systems including the probe head assemblies and/or components thereof, and methods of operating the same. The probe head assemblies are configured to convey a plurality of test signals to and/or from a device under test and include a space transformer, a contacting assembly, and a riser that spatially separates the space transformer from the contacting assembly and conveys the plurality of test signals between the space transformer and the contacting assembly. The contacting assembly may include a frame that defines an aperture and has a coefficient of thermal expansion that is within a threshold difference of that of the device under test, a flexible dielectric body that is attached to the frame, maintained in tension by the frame, and extends across the aperture, and a plurality of conductive probes. The plurality of conductive probes may include a dual-faceted probe tip.

28 Claims, 5 Drawing Sheets

(56) References Cited

U.S. PATENT DOCUMENTS

| | | | |
|---|---|---|---|
| 6,036,502 A * | 3/2000 | Neidich | H01R 12/62 439/67 |
| 6,071,009 A | 6/2000 | Clyne | |
| 6,156,484 A * | 12/2000 | Bassous | G01R 1/06738 216/83 |
| 6,256,882 B1 * | 7/2001 | Gleason | G01R 1/0735 29/426.1 |
| 6,305,230 B1 | 10/2001 | Kasukabe et al. | |
| 6,441,315 B1 | 8/2002 | Eldridge et al. | |
| 6,617,863 B1 * | 9/2003 | Kasukabe | H05K 3/4007 324/755.01 |
| 6,842,023 B2 | 1/2005 | Yoshida et al. | |
| 7,178,711 B2 | 2/2007 | Wong et al. | |
| 7,182,672 B2 | 2/2007 | Tunaboylu et al. | |
| 7,190,181 B2 | 3/2007 | Peters et al. | |
| 7,218,131 B2 | 5/2007 | Tanioka et al. | |
| 7,368,925 B2 | 5/2008 | Navratil et al. | |
| 7,368,927 B2 * | 5/2008 | Smith | G01R 1/0735 324/754.07 |
| 7,550,983 B2 | 6/2009 | Gleason et al. | |
| 7,557,596 B2 | 7/2009 | Eldridge et al. | |
| 7,688,089 B2 * | 3/2010 | Audette | G01R 1/0735 324/754.18 |
| 7,862,391 B2 | 1/2011 | Johnston et al. | |
| 7,888,957 B2 | 2/2011 | Smith et al. | |
| 7,893,704 B2 | 2/2011 | Gleason et al. | |
| 2001/0009061 A1 * | 7/2001 | Gleason | G01R 1/0735 29/593 |
| 2003/0041443 A1 * | 3/2003 | Stevenson | H01H 13/83 29/622 |
| 2003/0082835 A1 * | 5/2003 | McChesney | H01J 37/32082 438/10 |
| 2003/0107388 A1 | 6/2003 | Reed et al. | |
| 2004/0223309 A1 * | 11/2004 | Haemer | G01R 1/07314 361/767 |
| 2005/0099763 A1 * | 5/2005 | Rathburn | G01R 1/0735 361/600 |
| 2005/0189958 A1 * | 9/2005 | Chen | G01R 1/0483 324/755.07 |
| 2005/0218429 A1 * | 10/2005 | Mazza | G01R 1/07378 257/209 |
| 2006/0241891 A1 * | 10/2006 | Kaushal | H01L 21/67248 702/136 |
| 2007/0178727 A1 * | 8/2007 | Igarashi | G01R 1/07314 439/91 |
| 2008/0054918 A1 | 3/2008 | Lin et al. | |
| 2008/0061808 A1 * | 3/2008 | Mok | C23C 26/00 324/754.07 |
| 2008/0293277 A1 * | 11/2008 | Kumar | H01R 13/53 439/247 |
| 2009/0212795 A1 | 8/2009 | Williams | |
| 2009/0214935 A1 * | 8/2009 | Berman | H01M 2/1066 429/61 |
| 2010/0127725 A1 | 5/2010 | Smith | |
| 2010/0237889 A1 | 9/2010 | Desta et al. | |
| 2010/0253374 A1 * | 10/2010 | Chen | G01R 31/31905 324/756.03 |
| 2010/0271062 A1 * | 10/2010 | Breinlinger | G01R 31/2891 324/756.03 |

* cited by examiner

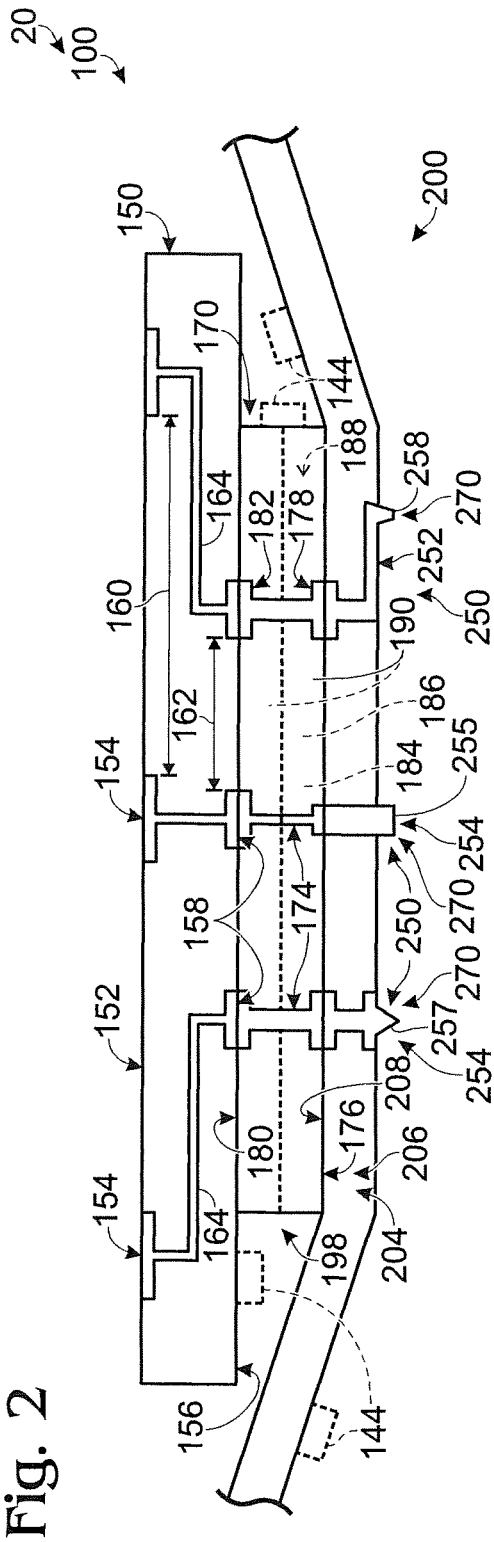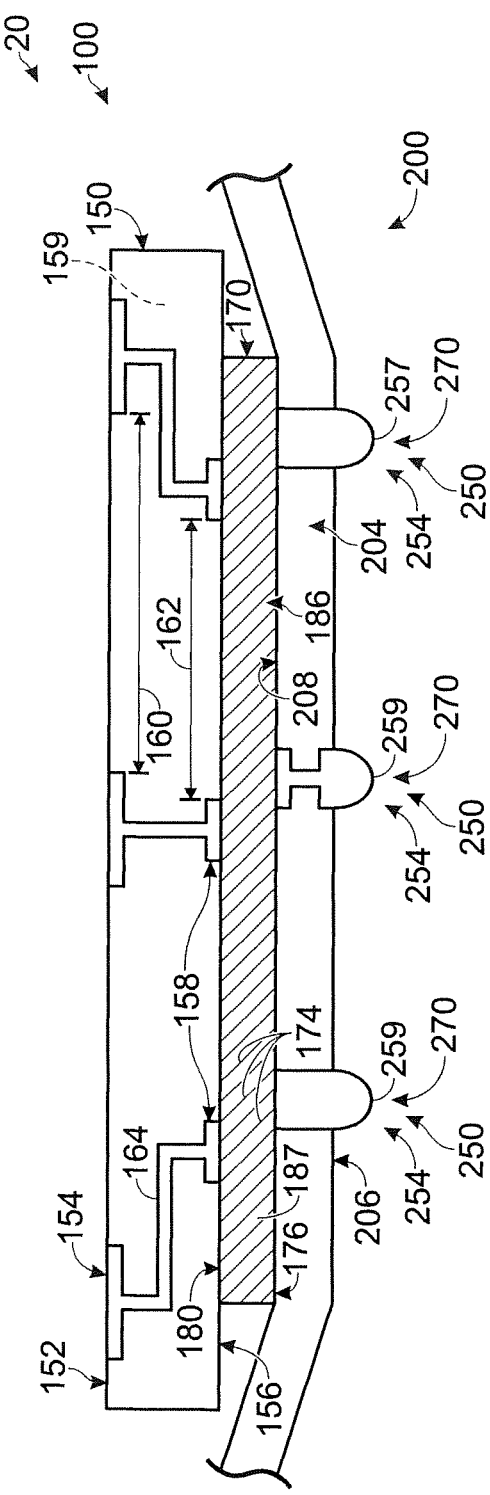

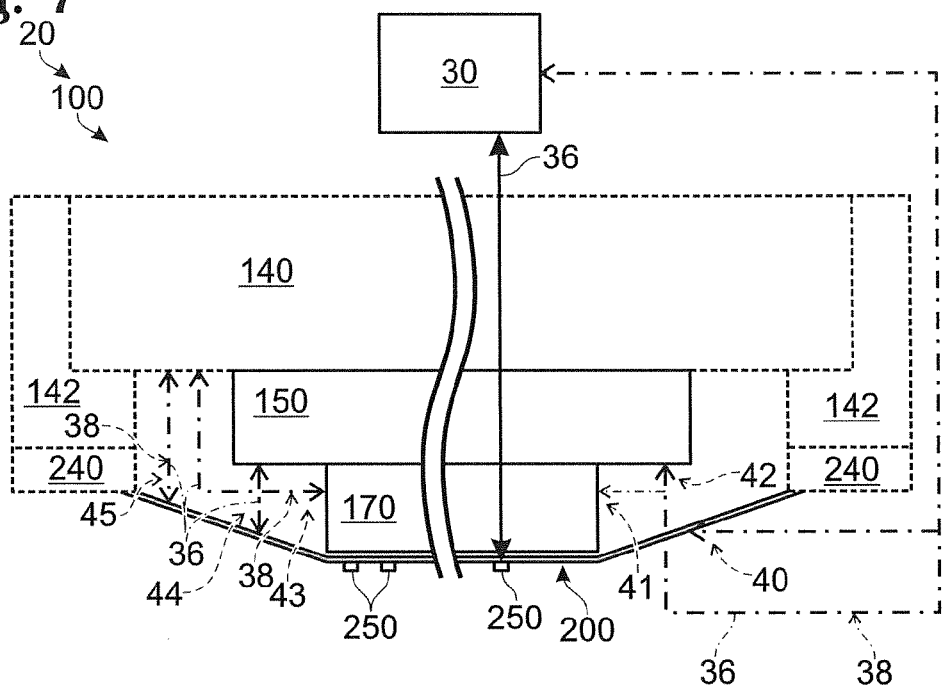
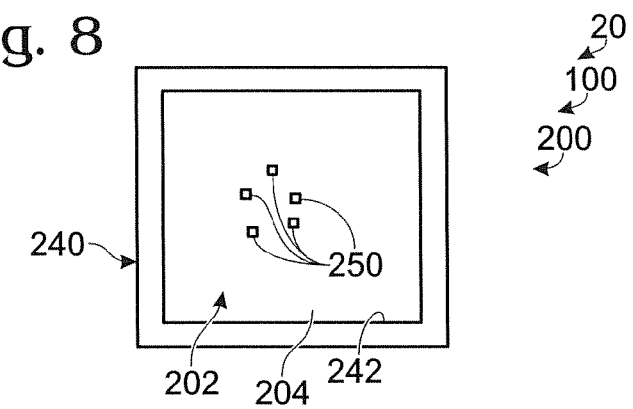
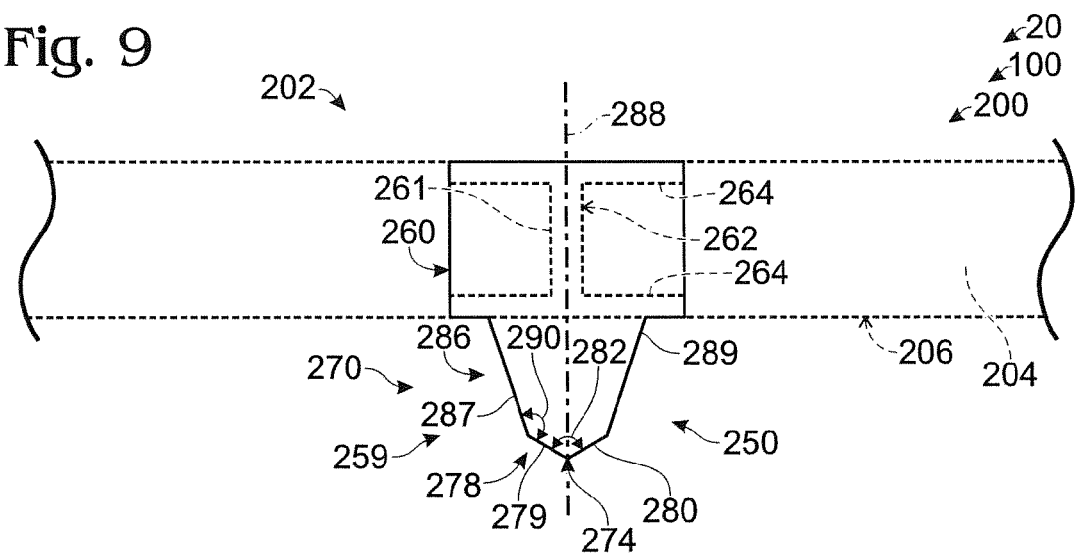

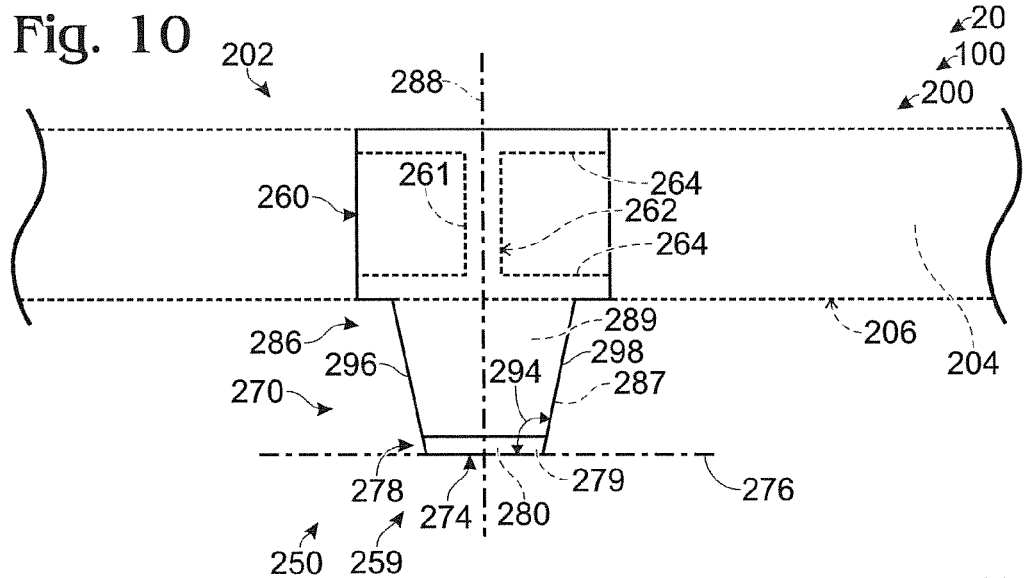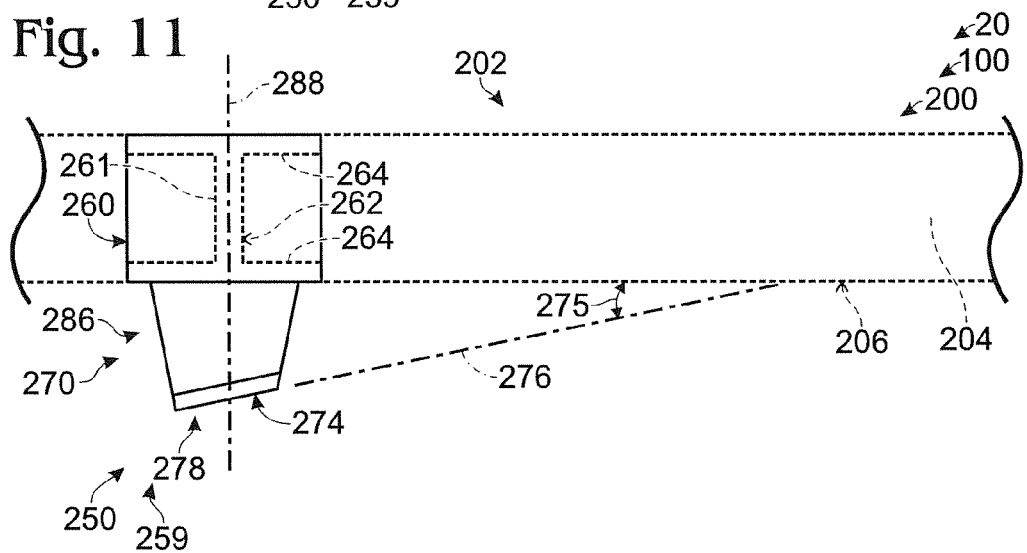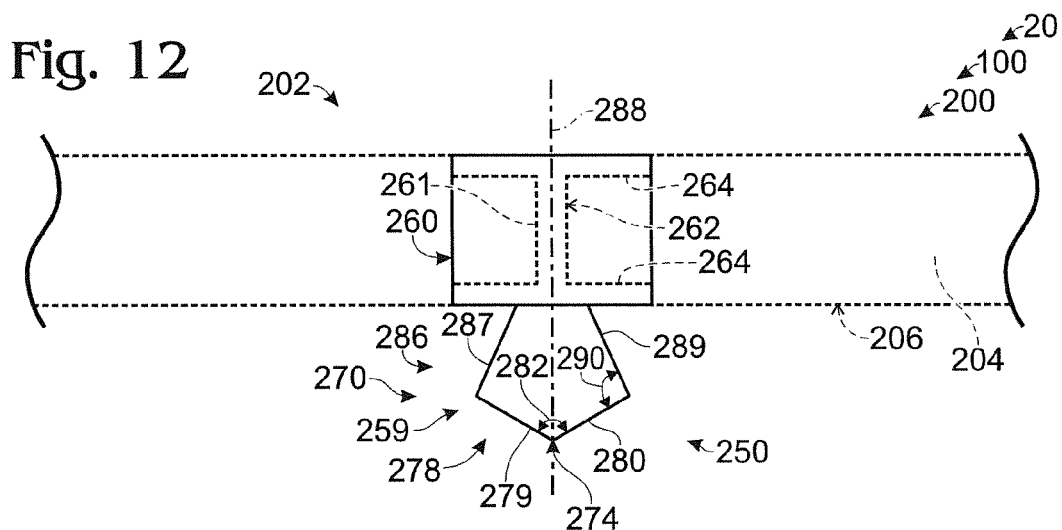

ated on a single device substrate. After these devices are fabricated, they may be subject to various tests to verify functionality, quantify operating characteristics, and/or characterize the manufacturing process. Additionally or alternatively, the devices may be packaged for communication with other devices and/or electronic components.
PROBE HEAD ASSEMBLIES, COMPONENTS THEREOF, TEST SYSTEMS INCLUDING THE SAME, AND METHODS OF OPERATING THE SAME

RELATED APPLICATION

This application claims priority to U.S. Provisional Patent Application No. 61/484,116, which was filed on May 9, 2011, and the complete disclosure of which is hereby incorporated by reference.

FIELD OF THE DISCLOSURE

The present disclosure is directed to probe head assemblies and components thereof that may be utilized to test a device under test, as well as to methods of operating the same.

BACKGROUND OF THE DISCLOSURE

The trend in electronic device production, particularly in integrated circuit technology, has been toward fabricating increasingly larger numbers of discrete circuit elements with higher operating frequencies and smaller circuit element geometries on a single device substrate. After these devices are fabricated, they may be subject to various tests to verify functionality, quantify operating characteristics, and/or characterize the manufacturing process. Additionally or alternatively, the devices may be packaged for communication with other devices and/or electronic components.

Traditionally, these electrical tests have been performed by forming a plurality of electrical contacts with a device under test (DUT), providing electric current to the DUT in the form of input, or test, signals, and receiving electric current or other outputs from the DUT in the form of output, or resultant, signals. The response of the DUT to various input signals and/or power levels may then be quantified through analysis of the input and/or output signals.

However, as a density of the individual circuit elements increases, a density and/or number of bond and/or contact pads, which may be contacted to perform the electrical testing, also may increase. Also, a pitch and/or spacing between adjacent pads may decrease and/or a size of the individual pads may decrease.

This evolution of integrated circuit technology presents unique challenges to the manufacturers of test systems that may be utilized to perform electrical tests. For example, the overall force that is applied to the DUT by the test system may need to be controlled to be below a threshold level despite significant increases in the number of electrical connections that may be made between the test system and the DUT. As another example, a vertical compliance of a probe head assembly that may be utilized to form the electrical connections with the DUT may need to be increased to maintain reliable electrical connection between the probe head assembly and the DUT despite the limitations in the overall force that is applied to the DUT. As yet another example, the nature of the physical interactions between the probe head assembly and the DUT may need to be controlled to provide for reliable electrical connections therebetween. Thus, there exists a need for improved probe head assemblies, probe head assembly components, and methods of operation thereof.

SUMMARY OF THE DISCLOSURE

Probe head assemblies, components of probe head assemblies, test systems including the probe head assemblies and/or components thereof, and methods of operating the same. The probe head assemblies are configured to convey a plurality of test signals to and/or from a device under test. The probe head assemblies include a space transformer, a contacting assembly, and a riser that spatially separates the space transformer from the contacting assembly and conveys the plurality of test signals between the space transformer and the contacting assembly. The contacting assembly may include a frame, a flexible dielectric body, and a plurality of conductive probes. The frame defines an aperture and has a coefficient of thermal expansion that is within a threshold difference, or threshold valve, of the coefficient of thermal expansion of the device under test. The flexible dielectric body is attached to the frame, maintained in tension by the frame, and extends across the aperture of the frame. The plurality of conductive probes may include at least one dual-faceted probe tip.

The space transformer may be configured to transform a spacing between the plurality of test signals as the plurality of test signals travel therethrough. The contacting assembly may be configured to form a plurality of test contacts with the device under test and to provide at least a first portion of the plurality of test signals thereto and/or receive a second portion of the plurality of test signals therefrom.

In some embodiments, the riser includes a substantially rigid riser. In some embodiments, the riser includes resilient riser. In some embodiments, the riser includes a composite riser assembly. In some embodiments, the riser, space transformer, and/or contacting assembly may include one or more surface-mounted electronic components. In some embodiments, the riser is configured to define an air gap between the one or more surface-mounted electronic components and the space transformer, riser, and/or contacting assembly. In some embodiments, one or more external test leads may convey one or more of the plurality of test signals between the control system and the device under test without the one or more control signals passing through the space transformer and/or the riser.

BRIEF DESCRIPTION OF THE DRAWINGS

FIG. 2 is a schematic cross-sectional view of illustrative, non-exclusive examples of a portion of a probe head assembly that includes a riser according to the present disclosure.

FIG. 3 is another schematic cross-sectional view of illustrative, non-exclusive examples of a portion of a probe head assembly that includes a riser according to the present disclosure.

FIG. 7 is a schematic cross-sectional view of illustrative, non-exclusive examples of a test system that may utilize an external test signal lead according to the present disclosure.

FIG. 8 is a schematic representation of an illustrative, non-exclusive example of a contacting assembly according to the present disclosure.

FIG. 9 is a schematic cross-sectional view of a first view of illustrative, non-exclusive examples of a contacting assembly that includes a dual-faceted conductive probe according to the present disclosure.

FIG. 10 is a schematic cross-sectional view of a second view of the contacting assembly of FIG. 8.

FIG. 11 is a schematic cross-sectional view of illustrative, non-exclusive examples of a contacting assembly that includes another dual-faceted conductive probe according to the present disclosure.

FIG. 12 is a schematic cross-sectional view of illustrative, non-exclusive examples of a contacting assembly that includes another dual-faceted conductive probe according to the present disclosure.

DETAILED DESCRIPTION AND BEST MODE OF THE DISCLOSURE

Figure 1:
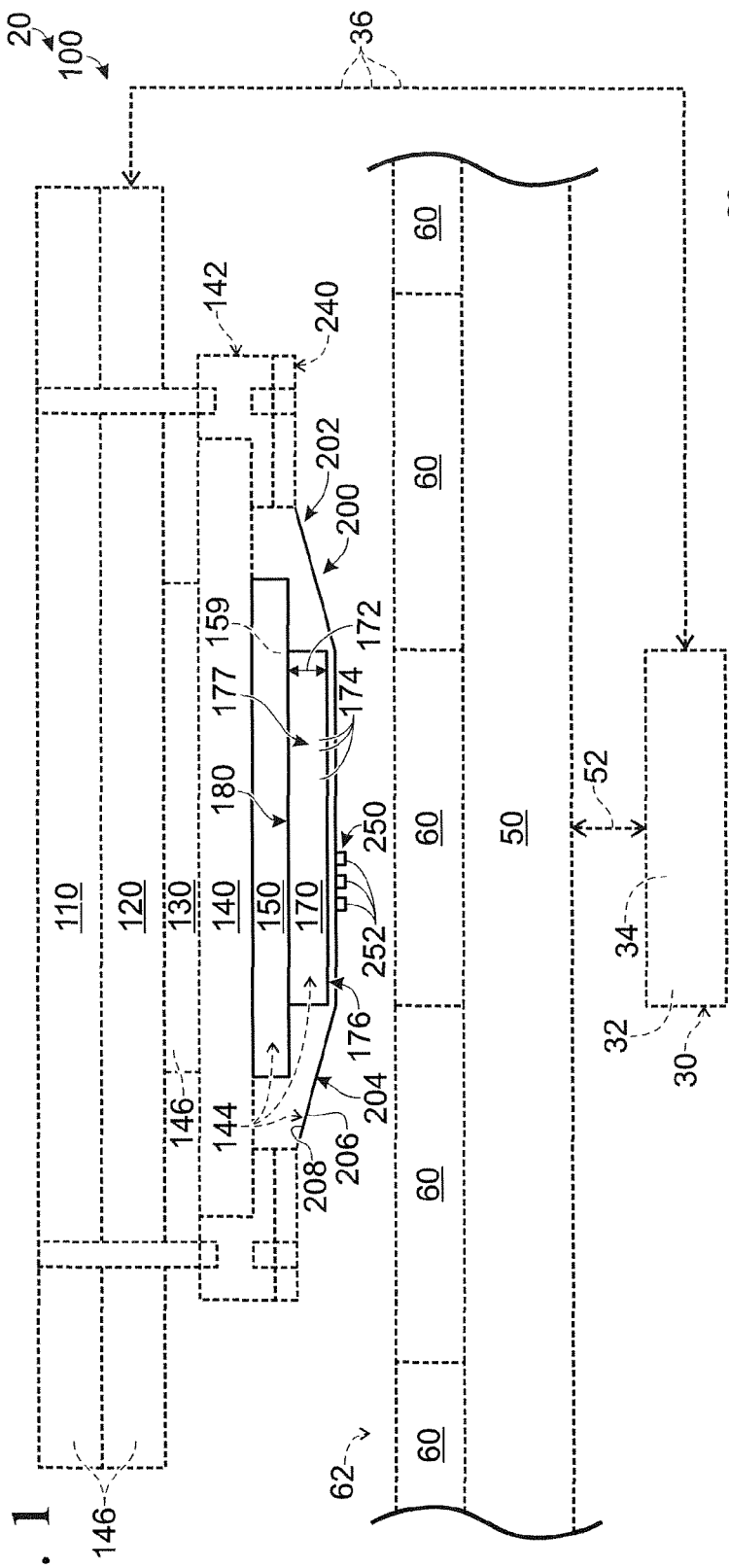
FIG. 1 is a schematic cross-sectional view of illustrative, non-exclusive examples of portions of a test system that may utilize the probe head assemblies, components thereof, and methods according to the present disclosure.

FIG. 1 is a schematic cross-sectional view of illustrative, non-exclusive examples of a test system 20 that may utilize and/or include the probe head assemblies, components thereof, and methods according to the present disclosure. Test system 20 includes a probe head assembly 100 that may include a plurality of components that are configured to form a plurality of test contacts between the probe head assembly and a device under test (DUT) 60 and to convey a plurality of test signals 36 between the DUT and a control system 30. The test system also may include and/or be utilized in combination with a chuck 50 that is configured to support DUT 60 and/or locate DUT 60 with respect to probe head assembly 100, and control system 30 may provide a chuck control signal 52 to chuck 50 to control the operation of the chuck.

Probe head assembly 100 includes a contacting assembly 200 that is configured to convey the plurality of test signals 36 between DUT 60 and a riser 170. Riser 170, which additionally or alternatively may be, include, and/or be referred to herein as a fine pitch interposer 170, is configured to convey the plurality of test signals between contacting assembly 200 and a space transformer 150.

As shown in dashed lines in FIG. 1, probe head assembly 100 optionally may include and/or be utilized with a plurality of additional components, including a space transformer riser 140, which additionally or alternatively may be, include, and/or be referred to herein as a wide pitch riser 140, a wide pitch interposer 130, and/or a printed circuit board 120 that are configured to distribute the plurality of test signals therein and/or convey the plurality of test signals therethrough. An optional stiffener 110 may provide mechanical support to probe head assembly 100, such as to provide for maintaining a desired level of planarity of the probe head assembly. A probe head frame 142, which may be operatively attached to space transformer riser 140, may locate a first portion of the plurality of additional components, such as space transformer riser 140, space transformer 150, riser 170, and/or contacting assembly 200 with respect to a second portion of the plurality of additional components, such as stiffener 110, printed circuit board 120, and/or wide pitch interposer 130. Similarly, frame 240, which also may be referred to herein as contacting assembly frame 240, may locate the contacting assembly with respect to a remainder of the probe head assembly and may be operatively attached to probe head frame 142.

Contacting assembly 200 may include any suitable structure that is configured to form the plurality of test contacts with DUT 60 and to convey the plurality of test signals 36 between DUT 60 and riser 170. As an illustrative, non-exclusive example, the contacting assembly may include a flexible dielectric body 204 that includes a first body surface 206 and an opposed second body surface 208. The contacting assembly also may include a plurality of conductive probes 250 that is configured to form the plurality of test contacts with the DUT and to convey the plurality of test signals between first body surface 206, which is proximal to DUT 60, and second body surface 208, which is proximal to riser 170.

As another illustrative, non-exclusive example, contacting assembly 200 may include and/or be a membrane probe assembly 202. Illustrative, non-exclusive examples of membrane probe assemblies 202 are disclosed in U.S. Pat. Nos. 7,178,711, 7,368,927, 7,550,983, and 7,893,704, the complete disclosures of which are hereby incorporated by reference. Additional illustrative, non-exclusive examples of contacting assemblies 200 according to the present disclosure, and/or components thereof, are discussed in more detail herein.

Contacting assembly 200 may be maintained in electrical and/or mechanical communication with riser 170 by any suitable mechanism and/or in any suitable manner. As an illustrative, non-exclusive example, the contacting assembly may be adhered to the riser. As another illustrative, non-exclusive example, the contacting assembly 200 may be operatively attached to and/or include frame 240, which may locate or otherwise support and/or position the contacting assembly within probe head assembly 100, and which is discussed in more detail herein with reference to FIG. 7. It is within the scope of the present disclosure that frame 240 may be configured to tension flexible dielectric body 204 of contacting assembly 200 across a first riser surface 176 of riser 170 to maintain the flexible dielectric body in a stretched state when the frame is mounted within the probe head assembly.

The tension of flexible dielectric body 204 may generate a restoring force that may maintain contacting assembly 200, such as flexible dielectric body 204 and/or conductive probes 250 thereof, in contact with first riser surface 176 and provide for transfer of the plurality of test signals therebetween. It is within the scope of the present disclosure that, while maintained in contact with riser 170 by the restoring force, contacting assembly 200 may not be operatively attached to the riser and/or may be configured to be removed from the probe head assembly and/or separated from the riser, such as for repair and/or replacement thereof.

As shown in FIG. 1, frame 240 may be configured to mount to probe head assembly 100 from a side, or region, of the probe head assembly that faces device under test 60 during testing of the device under test. This may provide for the removal of contacting assembly 200 from probe head assembly 100 without disassembly of, or at least without substantial disassembly of, a remainder of the components of the probe head assembly.

Riser 170 may serve a variety of purposes within probe head assembly 100. As an illustrative, non-exclusive example, and as discussed in more detail herein with reference to FIG. 2, riser 170 may provide a space, clearance, and/or air gap between space transformer 150 and contacting assembly 200 that may provide clearance for one or more surface-mounted electronic components 144 that may be present on space transformer 150, riser 170, and/or contacting assembly 200. As another illustrative, non-exclusive example, riser 170 may be configured to locate second body surface 208 of flexible dielectric body 204 and/or contacting surfaces of conductive probes 250 at a target location and/or within a target plane with respect to a location and/or plane of another portion of probe head assembly 100. This may include locating second body surface 208 and/or contacting surfaces 252 below a remainder of probe head assembly 100 to prevent contact, or undesired contact, between the DUT and the remainder of the probe head assembly. As yet another illustrative, non-exclusive example, riser 170 may be configured to maintain a desired degree of deformation and/or tension of contacting assembly 200 and/or flexible dielectric body 204 thereof when the contacting assembly is mounted within the probe head assembly.

Referring back to FIG. 1, riser 170 may include any suitable structure that is configured to spatially separate space transformer 150 from contacting assembly 200 and/or convey the plurality of test signals between the space transformer and the contacting assembly. As an illustrative, non-exclusive example, riser 170 may include and/or be a planar, or at least substantially planar, riser, or riser body 177, that includes first riser surface 176 and an opposed, or at least substantially opposed, second riser surface 180. A distance between first riser surface 176 and second riser surface 180 may define a riser thickness 172. Illustrative, non-exclusive examples of riser thickness according to the present disclosure include riser thicknesses of at least 0.025 mm, at least 0.5 mm, at least 0.75 mm, at least 0.1 mm, at least 0.2 mm, at least 0.3 mm, at least 0.4 mm, at least 0.5 mm, at least 0.6 mm, at least 0.7 mm, at least 0.8 mm, at least 0.9 mm, or at least 1 mm and/or riser thicknesses of less than 3 mm, less than 2.75 mm, less than 2.5 mm, less than 2.25 mm, less than 2 mm, less than 1.75 mm, less than 1.5 mm, less than 1.25 mm, less than 1 mm, less than 0.9 mm, less than 0.8 mm, less than 0.7 mm, less than 0.6 mm, or less than 0.5 mm.

As another illustrative, non-exclusive example, riser 170 may include a plurality of test signal conduits 174 that are configured to convey the plurality of test signals between the contacting assembly, or the plurality of conductive probes thereof, and the space transformer. It is within the scope of the present disclosure that the plurality of test signal conduits may include any suitable structure. As illustrative, non-exclusive examples, the plurality of test signal conduits may include and/or be a plurality of metallic conduits, a plurality of electrical conduits, a plurality of electrically conductive conduits, a plurality of optical conduits, a plurality of optically conductive conduits, a plurality of waveguides, and/or a plurality of electromagnetic radiation conductive conduits.

Riser 170 and/or riser body 177 thereof may include any suitable material properties and/or materials of construction. As an illustrative, non-exclusive example, riser body 177 may include and/or be a rigid, or at least substantially rigid, dielectric riser body. As another illustrative, non-exclusive example, riser body 177 may include and/or be a resilient dielectric riser body, an illustrative, non-exclusive example of which is or includes silicone.

Space transformer 150 may include any suitable structure that is configured to receive the plurality of test signals and to transform the spacing of the plurality of test signals from a first pitch, or average spacing, on a first surface of the space transformer to a second (different) pitch, or average spacing, on a second surface of the space transformer that is generally opposed to the first surface of the space transformer. As an illustrative, non-exclusive example, space transformer 150 may include a substantially planar space transformer that includes a space transformer body that defines the first surface of the space transformer and the second surface of the space transformer. As another illustrative, non-exclusive example, space transformer 150 may include, be operatively attached to, and/or be in electrical communication with a rigid fine pitch riser 159 that is configured to increase a thickness of space transformer 150. Additional illustrative, non-exclusive examples of space transformers 150 according to the present disclosure are discussed in more detail herein with reference to FIGS. 2-3.

Riser 170 may be fabricated separately from and placed into communication with space transformer 150. As an illustrative, non-exclusive example, the riser may be operatively attached to the space transformer, such as by adhesion and/or soldering. As another illustrative, non-exclusive example, the riser may be maintained in contact with the space transformer by one or more compressive forces. Alternatively, riser 170 may be fabricated with, fabricated on a surface of, and/or integral to space transformer 150.

Control system 30 may include any suitable structure that is configured to provide test signals 36 to, and/or receive test signals 36 from, DUT 60. As an illustrative, non-exclusive example, the control system may include, be in electrical communication with, and/or be a signal generator 32 that is configured to generate an input signal that is provided to the device under test and forms a portion of the plurality of test signals 36. As another illustrative, non-exclusive example, the control system may include, be in electrical communication with, and/or be a signal analyzer 34 that is configured to receive in output signal that is generated by the device under test and forms a portion of the plurality of test signals.

Test signals 36 may include any suitable signal that may be supplied to and/or received from DUT 60. It is within the scope of the present disclosure that the plurality of test signals may include a plurality of discrete test signals. Additionally or alternatively, it is also within the scope of the present disclosure that at least a first test signal of the plurality of test signals may be related to and/or interact with at least a second test signal of the plurality of test signals.

Illustrative, non-exclusive examples of test signals 36 according to the present disclosure include any suitable electrical signal, optical signal, electromagnetic signal, electromagnetic radiation, electric field, and/or magnetic field. Thus, and as used herein, the term "contact" may refer to any suitable type of contact, illustrative, non-exclusive examples of which include mechanical contact, conductive contact, electrically conductive contact, electromagnetically conductive contact, magnetically conductive contact, electric field conductive contact, and/or optically conductive contact. Similarly, and as used herein, the term "communication" may refer to any suitable type of communication, illustrative, non-exclusive examples of which include mechanical communication, conductive communication, electrically conductive communication, and/or optically conductive communication. It is within the scope of the present disclosure that the term "contact" may refer to direct and/or indirect physical contact between the components that are in communication. However, it is also within the scope of the present disclosure that the term "contact" may refer to any suitable communicative contact that does not necessarily include and/or rely upon direct and/or indirect physical contact between the components that are in communication. Illustrative, non-exclusive examples of such contact include reactively coupled communication and/or contact, inductive communication and/or contact, capacitive communication and/or contact, electromagnetic communication and/or contact, magnetic communication and/or contact, and/or optical communication and/or contact.

Device under test 60 may include any suitable structure that is configured to be tested by test system 20 and to receive and/or generate test signals 36. Illustrative, non-exclusive examples of devices under test (DUTs) 60 according to the present disclosure include any suitable electronic device, optical device, and/or optoelectronic device. As shown in FIG. 1, DUTs 60 may be present, formed, and/or fabricated on a substrate 62 that includes a plurality of DUTs. Illustrative, non-exclusive examples of substrates for DUTs 60 that may be utilized with the systems and methods according to the present disclosure include any suitable semiconductor wafer, silicon wafer, gallium arsenide wafer, and/or other III-V semiconductor wafers that include elements from Group III of the periodic table as well as elements from Group V of the periodic table, and/or wafers coated with one or more layers of one or more of these substances.

It is within the scope of the present disclosure that test system 20 may be configured to test at least a portion of the plurality of DUTs that may be present on substrate 62 prior to singulation, or separation, of the plurality of DUTs from the substrate. Alternatively, it is also within the scope of the present disclosure that test system 20 may be configured to test individual DUTs and/or groups of DUTs after singulation from the substrate.

As indicated in FIG. 1 at 146, probe head assembly 100 also may include and/or be in mechanical communication with one or more flexures 146 that are configured to limit a contact force that is applied to DUT 60 by probe head assembly 100 and/or contacting assembly 200 thereof during testing of the DUT. It is within the scope of the present disclosure that flexure 146 may be present at any suitable location and/or form a portion of any suitable component of the probe head assembly. As an illustrative, non-exclusive example, the flexure may be located on a side of the space transformer that is opposed to the contacting assembly. As another illustrative, non-exclusive example, flexure 146 may be located between printed circuit board 120 and space transformer 150. Illustrative, non-exclusive examples of flexures that may be utilized with the systems and methods according to the present disclosure include a resilient material, a resilient dielectric material with included conductive conduits, and/or a buckling beam.

FIGS. 2-3 are schematic cross-sectional views of illustrative, non-exclusive examples of a portion of probe head assemblies 100 according to the present disclosure. The probe head assemblies of FIGS. 2-3 may be substantially similar to the probe head assembly of FIG. 1 but provide additional, less schematic, but still illustrative, non-exclusive examples of riser 170, space transformer 150, and/or contacting assembly 200. In addition to the illustrated components, the probe head assemblies of FIGS. 2 and 3 may include one or more other components, as discussed in more detail herein with reference to FIG. 1.

Space transformer 150 may include a wide pitch surface 152 that include a plurality of wide pitch contact pads 154 that are separated by an average wide pitch spacing 160. Similarly, the space transformer also may include a narrow pitch surface 156 that includes a plurality of narrow pitch contact pads 158 that are separated by an average narrow pitch spacing 162. A plurality of space transformer conduits 164 may convey the plurality of test signals between respective wide pitch contact pads and respective narrow pitch contact pads, as schematically illustrated in FIG. 2.

Thus, the average wide pitch spacing is greater than the average narrow pitch spacing, and space transformer 150 is configured to change, or transform, the average spacing of the plurality of contact pads that are present therein from the average wide pitch spacing to the average narrow pitch spacing. Illustrative, non-exclusive examples of space transformers according to the present disclosure include any suitable printed circuit board, multilayer ceramic circuit, application-specific space transformer, space transformer (which optionally may be a customer-supplied space transformer), integrated circuit package, unpackaged integrated circuit device, and/or redistribution layer (which may be present on a surface of any of the preceding illustrative, non-exclusive examples of space transformers). When space transformer 150 includes and/or is a printed circuit board, probe head assembly 100 additionally or alternatively may be, include, and/or be referred to herein as a probe card assembly 100.

Contacting assembly 200 may include flexible dielectric body 204 and a plurality of conductive probes 250 that are configured to extend between first body surface 206 and second body surface 208 and to convey the plurality of test signals therebetween. Flexible dielectric body 204 additionally or alternatively may be referred to herein as flexible dielectric membrane 204. As shown in FIGS. 2-3, the plurality of conductive probes may include any suitable shape, illustrative, non-exclusive examples of which include a rocking beam probe 252 and/or an elongate probe 254. Similarly, a probe tip 270 of the conductive probes that is configured to contact the device under test may include any suitable shape, illustrative, non-exclusive examples of which include a blunt tip 255, a pointed tip 256, a rounded tip 257, a truncated tip 258, and/or a dual-faceted tip 259. Illustrative, non-exclusive examples of contacting assemblies 200 and/or conductive probes 250 according to the present disclosure are discussed in more detail herein with reference to FIGS. 7-11.

In contrast to space transformer 150, riser 170 may include a plurality of test signal conduits 174 and may be configured to maintain, or at least approximately maintain, a spacing of the plurality of test signal conduits between a first riser surface 176 and second riser surface 180. Thus, and although not required to all embodiments, it is within the scope of the present disclosure that riser 170 optionally may not be configured to function as a space transformer and/or may not be a space transforming device. Additionally or alternatively, and in contrast to space transformer 150, riser 170 may be configured to convey the plurality of test signals between the plurality of conductive probes 250 of contacting assembly 200 and space transformer 150 on a linear, or at least substantially linear, conduction path via test signal conduits 174.

In the illustrative, non-exclusive example of FIG. 2, riser 170 includes a plurality of second riser surface contact pads 182 that are configured to form a connection with narrow pitch contact pads 158 of space transformer 150 and to convey the plurality of test signals between the space transformer and the riser. Test signal conduits 174 interconnect the plurality of second riser surface contact pads 182 with a plurality of first riser surface contact pads 178, which are configured to form a connection with conductive probes 250 and to convey the plurality of test signals between contacting assembly 200 and the riser. As discussed in more detail herein, a pitch, or spacing, between the plurality of first riser surface contact pads 178 may be similar to a pitch, or spacing, between the plurality of second riser surface contact pads 182.

In addition, and as shown in FIG. 2, a selected first riser surface contact pad may be opposed, or at least substantially opposed, to a respective second riser surface contact pad. Thus, test signal conduits 174 may include a longitudinal axis that is parallel to, or at least substantially parallel to, a surface normal direction of first riser surface 176 and/or second riser surface 180. This surface normal direction also may be referred to herein as a direction that is perpendicular to a plane that is parallel to first riser surface 176 and/or second riser surface 180.

Riser 170 may include and/or be a rigid, or at least substantially rigid, riser 184 that is not configured to deform, or substantially deform, when placed within probe head assembly 100 and/or utilized to test a DUT. Additionally or alternatively, the riser also may include and/or be a resilient riser 186 that is configured to deform when placed within the probe head assembly and/or utilized to test a DUT. As shown in dashed lines in FIG. 2 and discussed in more detail herein with reference to FIGS. 4-5, riser 170 may include a composite riser 188, which also may be referred to herein as a composite riser assembly 188, that includes a plurality of riser layers 190.

It is within the scope of the present disclosure that first riser surface 176 may be parallel to, or at least substantially parallel to, narrow pitch surface 156 of space transformer 150. Alternatively, it is also within the scope of the present disclosure that at least a portion of first riser surface 176 may not be parallel to narrow pitch surface 156. As an illustrative, non-exclusive example, and with reference to FIG. 1, first riser surface 176 may be lapped, polished, and/or otherwise planarized to be parallel to, or at least substantially parallel to, any suitable reference plane and/or surface. Illustrative, non-exclusive examples of reference planes and/or surfaces according to the present disclosure include any suitable device under test proximal side, and/or device under test distal side, of a component of probe head assembly 100, such as stiffener 110, printed circuit board 120, wide pitch interposer 130, space transformer riser 140, probe head frame 142, and/or space transformer 150.

As shown in dashed lines in FIG. 2, space transformer 150, riser 170, and/or contacting assembly 200 may include and/or be operatively attached to one or more surface-mounted electronic components 144. Surface-mounted electronic components 144 may be and/or include electronic devices that are attached, such as by compressive force, pressure, clamping, adhesion, and/or soldering, to a suitable surface and are configured to interact with and/or alter one or more of the test signals in any suitable manner. Illustrative, non-exclusive examples of surface-mounted electronic components 144 that may be utilized with the systems, probe head assemblies, and/or methods according to the present disclosure include active electronic components, passive electronic components, electronic filters, capacitors, inductors, resistors, transistors, and/or integrated circuits.

As shown in FIG. 2, riser 170 may be configured to provide clearance for the one or more surface-mounted electronic components 144, such as to prevent and/or decrease a potential for physical contact between the surface-mounted electronic components and portions of the probe head assembly upon which the surface-mounted electronic component is not mounted. As an illustrative, non-exclusive example, riser 170 may define an air gap 198 between space transformer 150 and contacting assembly 200, and the surface-mounted electronic component may be present within the air gap.

It is within the scope of the present disclosure that any of the probe head assemblies 100, space transformers 150, risers 170, and/or contacting assemblies 200 disclosed herein may include one or more surface-mounted electronic components. These surface-mounted electronic components may be located at any suitable location within the probe head assembly and/or may perform any suitable function within the probe head assembly.

In the illustrative, non-exclusive example of FIG. 3, riser 170 includes a resilient riser 186 that is configured to deform when placed within probe head assembly 100 and/or utilized to test the DUT. Resilient riser 186 may include a plurality of test signal conduits 174 that are contained at least partially within a resilient dielectric riser body 187, include a spacing that is less than a spacing of conductive probes 250 and/or narrow-pitch contact pads 158, and are oriented at an angle, such as a skew angle, with respect the surface normal direction of first riser surface 176 and/or second riser surface 180. Thus, and as shown in FIG. 3, a plurality of test signal conduits 174 may form the connection between a selected conductive probe 250 and a respective narrow-pitch contact pad 158. In addition, and due to the angled orientation of the plurality of test signal conduits 174 with respect to the surface normal direction, narrow-pitch contact pads 158 may be spatially offset from conductive probes 250 within the probe head assembly to provide for the connection therebetween via test signal conduits 174. As shown in dashed lines in FIG. 3, space transformer 150 may (but is not required to) include rigid fine pitch riser 159, which may increase a thickness of the space transformer and/or increase a distance between wide pitch surface 152 and narrow pitch surface 156 of the space transformer.

Figure 4:
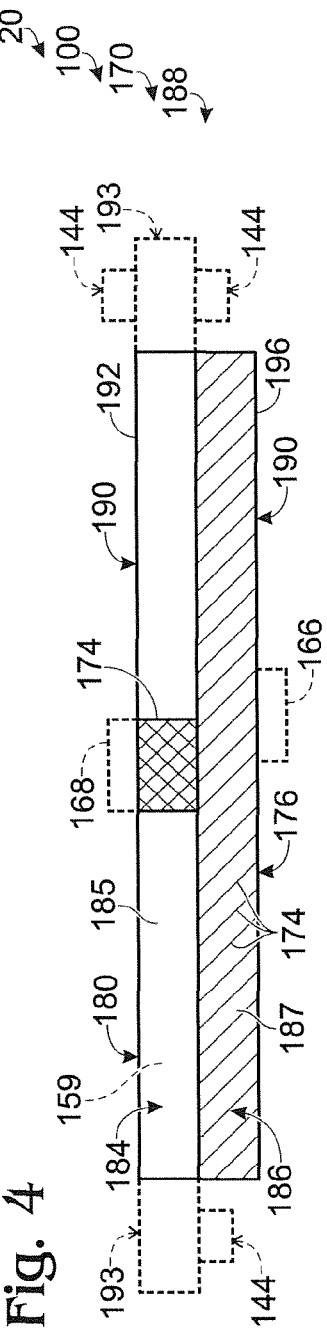
FIG. 4 is a schematic cross-sectional view of illustrative, non-exclusive examples of a composite riser assembly according to the present disclosure.
Figure 5:
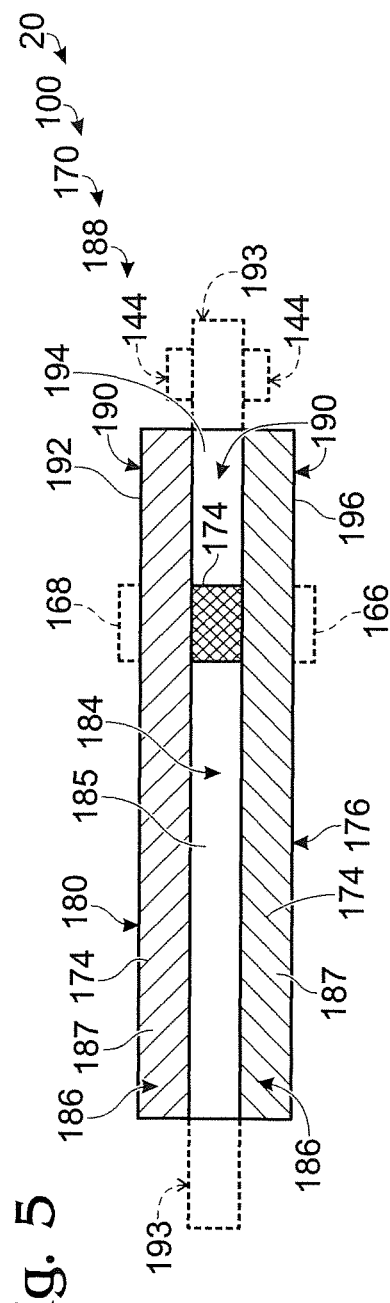
FIG. 5 is another schematic cross-sectional view of illustrative, non-exclusive examples of a composite riser assembly according to the present disclosure.

FIGS. 4-5 are schematic cross-sectional views of illustrative, non-exclusive examples of risers 170 in the form of composite risers 188, which also may be referred to herein as composite riser assemblies 188, according to the present disclosure. In FIG. 4, the composite riser includes two riser layers 190 including a first riser 192 (or first riser layer 192) and a second riser 196 (or second riser layer 196). First riser layer 192 may be a rigid riser 184 that includes a rigid dielectric riser body 185 and a plurality of test signal conduits 174 that convey the plurality of test signals through the riser in a direction that at least substantially parallel to a surface normal direction of first riser surface 176 and/or second riser surface 180. In contrast, second riser layer 196 may be a resilient riser 186 that includes a resilient dielectric riser body 187, which may include and/or be formed from silicone, and a plurality of test signal conduits 174 that are oriented at an angle, such as a skew angle, with respect to the surface normal direction of first riser surface 176 and/or second riser surface 180. Thus, and as shown in dashed lines in FIG. 4, a contact pad 166 that is configured to contact first riser surface 176 may be spatially offset from a contact pad 168 that is configured to contact second riser surface 180. It is within the scope of the present disclosure that the particular angles to be utilized may vary, such as according to one or more of the particular embodiment being utilized, design preferences, spatial constraints, desired contact pad alignment, materials of construction, etc. Furthermore, while some embodiments may utilize test signal conduits 174 that extend at skew, or otherwise inclined, angles, the use of test signal conduits 174 that extend parallel to the surface normal direction is not precluded and instead is within the scope of the present disclosure.

In FIG. 5, the composite riser includes three riser layers 190 including first riser layer 192, intermediate riser layer 194, and second riser layer 196. First riser layer 192 and second riser layer 196 may include resilient risers 186 that are similar to second riser layer 196 of FIG. 4, while intermediate riser layer 194 may include a rigid riser 184 that is similar to first riser layer 192 of FIG. 4. Angled test signal conduits 174 of first riser layer 192 may be oriented in an opposite direction from the angled test signal conduits of second riser layer 196. Thus, and as shown in dashed lines in FIG. 5, a contact pad 166 that is configured to contact first riser surface 176 may be opposed to, or at least substantially opposed to, a contact pad 168 that is configured to contact second riser surface 180. While only a single intermediate riser layer 194 is shown in FIG. 5, it is within the scope of the present disclosure that composite riser 188 may include a plurality of intermediate riser layers.

As shown in dashed lines in FIGS. 4-5, one or more selected riser layers 190 may include one or more extension regions 193 that may extend past a remainder of the riser layers of composite riser 188. The extension region(s) may serve as a mounting location for one or more surface-mounted electronic components 144, illustrative, non-exclusive examples of which are discussed in more detail herein.

Figure 6:
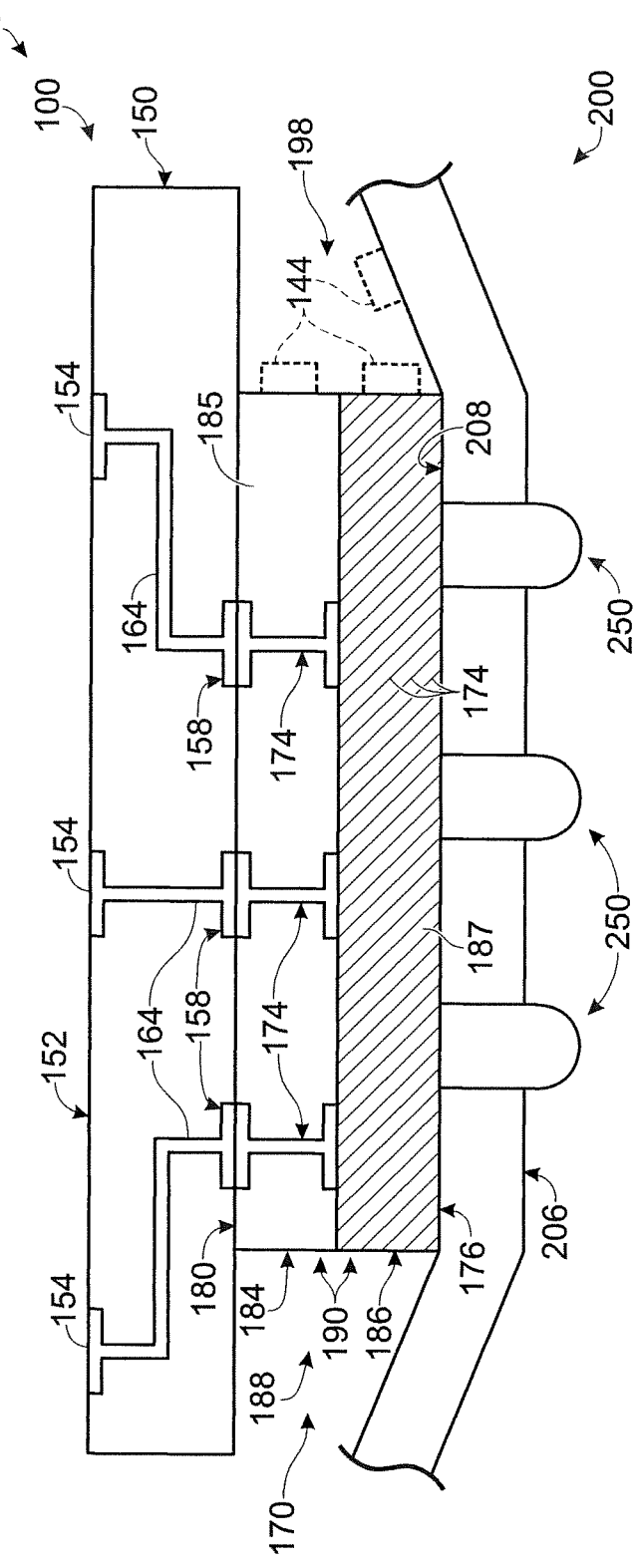
FIG. 6 is a schematic cross-sectional view of illustrative, non-exclusive examples of a portion of a probe head assembly that includes a composite riser according to the present disclosure.

FIG. 6 is a schematic cross-sectional view of another illustrative, non-exclusive example of a probe head assembly 100 according to the present disclosure. In particular, FIG. 6 illustrates a probe head assembly 100 that includes an illustrative, non-exclusive example of a composite riser 188. The probe head assembly of FIG. 6 is substantially similar to the probe head assemblies of FIGS. 2-3, with like numbers denoting like components. Accordingly, the preceding discussion of components, elements, subelements, materials of construction, variants, etc. from FIGS. 2-3 may apply to the probe head assembly of FIG. 6, in which all of the reference numbers from FIGS. 2-3 have not been repeated in an effort to simplify the presentation of the further illustrative embodiment. However, and as mentioned, riser 170 of FIG. 6 may include and/or be a composite riser 188. As illustrated, composite riser 188 includes riser layers 190, in the form of rigid riser 184 and resilient riser 186, and may be the same as (or substantially similar to) the composite riser of FIG. 4. As shown in FIG. 6, rigid riser 184 may be located between resilient riser 186 and space transformer 150 and may spatially separate resilient riser 186 and/or contacting assembly 200 from space transformer 150, thereby creating and/or defining an air gap 198 between the space transformer and the contacting assembly. Air gap 198 may provide clearance for one or more surface-mounted electronic components 144, as shown. It is also within the scope of the present disclosure that probe head assembly 100 may be formed with the composite riser 188 that is shown in FIG. 5.

When riser 170 is a composite riser 188 with a plurality of riser layers 190, the riser layers may be maintained in contact and/or electrical communication with one another, with space transformer 150, and/or with contacting assembly 200 in any suitable manner and/or via any suitable mechanism. As an illustrative, non-exclusive example, a compressive force may maintain the contact and/or electrical communication. As another illustrative, non-exclusive example, first riser layer 192 may be operatively attached to, fabricated on, and/or form a portion of space transformer 150. When first riser layer 192 is operatively attached to, is fabricated on, and/or forms a portion of space transformer 150 and includes rigid riser layer 184, first riser layer 192 also may be, include, and/or be referred to herein as rigid fine pitch riser 159. As yet another illustrative, non-exclusive example, a selected riser layer may be operatively attached to an adjacent, or opposed, riser layer. It is within the scope of the present disclosure that riser layers 190 may be operatively attached to one another, to space transformer 150, and/or to contacting assembly 200 in any suitable manner, illustrative, non-exclusive examples of which include being bonded, adhered, and/or soldered.

FIG. 7 is a schematic cross-sectional view of illustrative, non-exclusive examples of a test system 20 that may utilize an external test signal lead 38 according to the present disclosure. The test system of FIG. 7 includes at least space transformer 150, riser 170, contacting assembly 200, and one or more external test leads 38. Similar to the test system of FIG. 1, probe head frame 142 may be operatively attached to space transformer riser 140 and may be configured to locate the space transformer riser with respect to a portion of the probe head assembly. In addition, and also similar to the test system of FIG. 1, a frame 240 may be operatively attached to probe head frame 142 and may be configured to locate contacting assembly 200 with respect to a remainder of the probe head assembly. As shown in FIG. 7, and also similar to FIG. 1, a first portion of the plurality of test signals is conveyed between control system 30 and conductive probes 250 of contacting assembly 200 by traveling, or passing, through at least space transformer 150 and riser 170 and also may travel vertically through space transformer riser 140, as shown.

As an illustrative, non exclusive example, and depending on the nature of test signals 36 and/or the construction of probe head assembly 100, at least a portion of the test signals may degrade if passed through space transformer riser 140, space transformer 150, riser 170, and/or contacting assembly 200. Thus, and to improve signal integrity of the portion of the plurality of test signals the one or more external test signal leads may be utilized. Such external test signal leads may be used for test signals that do not degrade, or substantially degrade, if passed through space transformer riser 140, space transformer 150, riser 170, and/or contacting assembly 200. As shown in FIG. 7, test system 20 optionally may include one or more external test signal leads 38, which may bypass at least a portion of the probe head assembly and/or provide the portion of the plurality of test signals directly between two or more components of the probe head assembly. In other words, and in the illustrative, non-exclusive example of FIG. 7, at least a second portion of the plurality of test signals 36, which also may be referred to herein an external test signal, is conveyed between control system 30 and conductive probes 250 via one or more external test signal leads 38 that may bypass at least one of space transformer riser 140, space transformer 150, and/or riser 170.

As an illustrative, non-exclusive example, and as indicated in FIG. 7 at 40, the external test signal may be conveyed directly between control system 30 and contacting assembly 200. As another illustrative, non-exclusive example, and as indicated at 41, the external test signal may be conveyed directly between control system 30 and riser 170, with riser 170 conveying the external test signal to and/or from contacting assembly 200. As another illustrative, non-exclusive example, and as indicated at 42, the external test signal may be conveyed directly between control system 30 and space transformer 150, with space transformer 150 and riser 170 conveying the external test signal to and/or from contacting assembly 200. As another illustrative, non-exclusive example, and as indicated at 43, the external test signal may be conveyed between space transformer riser 140 and riser 170, bypassing space transformer 150. As another illustrative, non-exclusive example, and as indicated at 44, the external test signal may be conveyed between space transformer 150 and contacting assembly 200, bypassing riser 170. As yet another illustrative, non-exclusive example, and as indicated at 45, the external test signal may be conveyed between space transformer riser 140 and contacting assembly 200, bypassing space transformer 150 and riser 170.

External test signal lead 38 may include any suitable structure, such as a conductive trace, that is configured to convey the external test signal on a path that is external to one or more of spacer transformer riser 140, space transformer 150, and/or riser 170. Illustrative, non-exclusive examples of external test signal leads 38 according to the present disclosure include a controlled impedance structure, a strip line structure, a co-planar structure, a waveguide, and/or a fiber optic cable.

It is within the scope of the present disclosure that probe head assembly 100 may be configured to convey the plurality of test signals between DUT 60 and control system 30 without transferring any of the plurality of test signals along a conductive trace that is present on a surface of and/or within flexible dielectric body 204 of contacting assembly 200. However, it is also within the scope of the present disclosure that external test signal lead 38 may include a conductive trace that may be present on the surface of and/or within the flexible dielectric body. In addition, and while only discussed herein with reference to FIG. 7, it is within the scope of the present disclosure that any of the test systems 20 and/or probe head assemblies 100 disclosed herein may include and/or utilize one or more external test signal leads 38.

FIG. 8 is a schematic representation of an illustrative, non-exclusive example of a contacting assembly 200 according to the present disclosure. Contacting assembly 200 includes a frame 240 that defines an aperture 242. A flexible dielectric body 204 is operatively attached to frame 240, is maintained in tension by frame 240, and extends across aperture 242 thereof. A plurality of conductive probes 250 is operatively attached to flexible dielectric body 204. As discussed in more detail herein, flexible dielectric body 204 and conductive probes 250 may form a portion of a membrane probe assembly 202.

Test systems 20 and/or probe head assemblies 100 that include contacting assembly 200 of FIG. 8 may be configured for operation, or to test the device under test, at a plurality of different temperatures that includes at least a minimum temperature and a maximum temperature, wherein the minimum temperature and the maximum temperature define a threshold temperature range. Illustrative, non-exclusive examples of minimum temperatures according to the present disclosure include minimum temperatures of, or of less than, −50 degrees C., −40 degrees C., −30 degrees C., −20 degrees C., −10 degrees C., 0 degrees C., 10 degrees C., 20 degrees C., 30 degrees C., 40 degrees C., 50 degrees C., 60 degrees C., or 70 degrees C. Illustrative, non-exclusive examples of maximum temperatures according to the present disclosure include maximum temperatures of, or of at least, 90 degrees C., 100 degrees C., 110 degrees C., 120 degrees C., 130 degrees C., 140 degrees C., 150 degrees C., 160 degrees C., 170 degrees C., or 180 degrees C. Illustrative, non-exclusive examples of threshold temperature ranges according to the present disclosure include threshold temperature ranges of at least 20 degrees C., at least 30 degrees C., at least 40 degrees C., at least 50 degrees C., at least 60 degrees C., at least 70 degrees C., at least 80 degrees C., at least 90 degrees C., at least 100 degrees C., at least 110 degrees C., at least 120 degrees C., at least 130 degrees C., at least 140 degrees C., at least 150 degrees C., at least 160 degrees C., at least 170 degrees C., or at least 180 degrees C.

When test systems 20 are operated at a plurality of different temperatures, thermally induced expansion and/or contraction of the components thereof may produce misalignment of conductive probes 250 relative to respective contact pads on a device under test that the conductive probes are configured to contact. As an illustrative, non-exclusive example, when flexible dielectric body 204 has a coefficient of thermal expansion that differs significantly from the coefficient of thermal expansion of the device under test, changes in temperature may produce the misalignment due to differences in the expansion and/or contraction of flexible dielectric body 204 relative to the device under test.

In order to maintain contact between the plurality of conductive probes and the respective contact pads on the device under test, flexible dielectric body 204 may be maintained in tension within frame 240 throughout the threshold temperature range, and frame 240 may be selected from a material that has a coefficient of thermal expansion that is within a threshold difference of a coefficient of thermal expansion of the device under test. Thus, frame 240 may expand and/or contract at a rate that is comparable to an expansion and/or contraction rate of the device under test, expand and/or contract flexible dielectric body 204 at a comparable rate, and maintain contact and/or alignment between the plurality of conductive probes and the respective contact pads on the device under test. Additionally or alternatively, the coefficient of thermal expansion of frame 240 may be selected to be greater than a coefficient of thermal expansion of flexible dielectric body 204, which also may serve to maintain the flexible dielectric body in tension throughout the threshold temperature range.

Illustrative, non-exclusive examples of threshold coefficient of thermal expansion differences according to the present disclosure include threshold differences of less than 25%, less than 20%, less than 15%, less than 10%, less than 5%, less than 4%, less than 3%, less than 2%, less than 1%, less than 0.5%, less than 0.1%, substantially zero, or zero. As an illustrative, non-exclusive example the frame and the device under test may be constructed from the same, or substantially the same, material, and the threshold coefficient of thermal expansion difference may be substantially zero, or zero.

It is within the scope of the present disclosure that contacting assembly 200 of FIG. 8 may be utilized with any of the test systems 20 and/or probe head assemblies 100 that are disclosed herein. When the contacting assembly is mounted and/or utilized within a probe head assembly 100, frame 240 may be configured to stretch flexible dielectric body 204 across a surface of a riser to maintain contact between the plurality of conductive probes of the contacting assembly and the riser. It is also within the scope of the present disclosure that, as shown in FIG. 1, contacting assembly 200 may be mounted to probe head assembly 100 from a side or region, of the probe head assembly that faces device under test 60 during testing of the device under test.

FIGS. 9-12 are schematic cross-sectional views of illustrative, non-exclusive examples of a conductive probe 250 according to the present disclosure. Conductive probe 250 of FIGS. 9-12 may form a portion of a contacting assembly 200, a membrane probe assembly 202, a probe head assembly 100, and/or a test system 20 and may be utilized with any of the systems and methods that are disclosed herein.

Conductive probe 250 includes a probe base 260 that is configured to operatively attach the conductive probe to a flexible dielectric body 204 of contacting assembly 200. The conductive probe also includes a probe tip 270 that extends from probe base 260 and is configured to project from a first body surface 206 of the flexible dielectric body and to electrically contact a device under test that is positioned therebelow.

Probe base 260 may include any suitable structure that is configured to operatively attach and/or retain conductive probe 250 within flexible dielectric body 204. As an illustrative, non-exclusive example, and as shown in FIGS. 9-12, probe base 260 may extend past a base of probe tip 270 in a direction that is parallel to first body surface 206 of flexible dielectric body 204. This extension may provide one or more light-reflecting surfaces that may improve optical alignment between the conductive probe and the device under test. As another illustrative, non-exclusive example, a projection of conductive probe 250 in a direction that is parallel to a surface normal of first body surface 206 may include a geometric shape that may be readily recognized by probe tip alignment software of test system 20. Illustrative, non-exclusive examples of geometric shapes according to the present disclosure include circles, squares, rectangles, polygons, and/or trapezoids. As yet another illustrative, non-exclusive example, and as shown in dashed lines in FIGS. 9-12, the probe base may include a rivet-shaped probe base 262 that includes a pair of spaced-apart, radially projecting ridges 264, which also may be referred to herein as ridges 264.

Ridges 264 may be configured to provide an increased surface area for an adhesive bond between flexible dielectric body 204 and conductive probe 250. Additionally or alternatively, the ridges also may be configured to capture a portion of the flexible dielectric body therebetween and to retain the conductive probe within the flexible dielectric body despite deformation of the flexible dielectric body due to the application of one or more contact forces to the conductive probe. It is within the scope of the present disclosure that ridges 264 may extend any suitable distance and/or amount from probe base 260 and/or probe base shaft 261. As illustrative, non-exclusive examples, and when probe base shaft 261 includes a cylindrical probe base shaft with a probe base shaft outer diameter, an outer diameter of ridges 264 may be at least 100%, at least 150%, at least 200%, at least 250%, at least 300%, at least 400%, at least 500%, at least 600%, at least 700%, at least 800%, at least 900% or at least 1000% of the probe base shaft outer diameter. Additionally or alternatively, the outer diameter of ridges 264 may be less than 1500%, less than 1250%, less than 1000%, less than 900%, less than 800%, less than 700%, less than 600%, or less than 500% of the probe base shaft outer diameter.

In addition, and while rivet-shaped probe base 262 is only shown in FIGS. 9-12, it is within the scope of the present disclosure that the rivet-shaped probe base may be utilized with any suitable conductive probe 250 that forms a portion of a contacting assembly 200. As illustrative, non-exclusive examples, rivet-shaped probe base 262 may be utilized with any suitable rocking beam probe and/or elongate probe that includes any suitable tip shape, including a blunt tip, a pointed tip, a rounded tip, a truncated tip, and/or a dual-faceted tip.

Probe tip 270 includes a dual-faceted shape 259 and may be referred to herein as dual-faceted probe tip 270. The dual-faceted shape includes an elongate apex 274 that is configured to penetrate a contacted portion of the device under test, a wedge-shaped region 278 that includes the elongate apex, and/or extends therefrom, to define a wedge angle 282, and an extension region 286 that tapers from the probe base to the wedge-shaped region and defines a taper angle 290.

FIG. 9 is a cross-sectional view of a conductive probe 250 that is taken along a plane that is perpendicular to elongate apex 274 and parallel to a longitudinal axis 288 of the conductive probe. In contrast, FIG. 10 is a cross-section view of a similar conductive probe 250 that is taken along a plane that is parallel to the elongate apex and parallel to longitudinal axis 288 of the conductive probe. Thus, FIGS. 9-10 provide complementary, or perpendicular, views of the same conductive probe structure. In contrast, FIGS. 11-12 provide illustrative, non-exclusive examples of additional and/or alternatively conductive probes 250 according to the present disclosure.

As perhaps best shown in FIGS. 9 and 12, conductive probes 250 according to the present disclosure may include a symmetrical, or at least substantially symmetrical, cross-sectional shape, at least in a plane that is perpendicular to elongate apex 274 and parallel to longitudinal axis 288. As also shown in FIGS. 9 and 12, wedge-shaped region 278 may include a first wedge surface 279 and a second wedge surface 280, with wedge angle 282 being defined by an angle of intersection between the first wedge surface and the second wedge surface and/or as an angle of intersection between a plane that is parallel to the first wedge surface and a plane that is parallel to the second wedge surface. Illustrative, non-exclusive examples of wedge angles 282 according to the present disclosure include wedge angles of less than 150 degrees, less than 140 degrees, less than 130 degrees, less than 120 degrees, less than 110 degrees, less than 100 degrees, or less than 90 degrees, and/or wedge angles of greater than 70 degrees, greater than 80 degrees, greater than 90 degrees, greater than 100 degrees, greater than 110 degrees, greater than 120 degrees, or greater than 130 degrees. As perhaps best shown in FIG. 10, a longitudinal axis 276 of elongate apex 274 may define, be coextensive with, and/or be parallel to, a line of intersection between the first wedge surface and the second wedge surface.

With continued reference to FIGS. 9 and 12, extension region 286 may include a first extension surface 287, which extends between probe base 260 and first wedge surface 279, and a second extension surface 289, which extends between probe base 260 and second wedge surface 280. Taper angle 290 may be defined as an angle of intersection between first extension surface 287 and first wedge surface 279 and/or as an angle of intersection between second extension surface 289 and second wedge surface 280. Illustrative, non-exclusive examples of taper angles 290 according to the present disclosure include taper angles of less than 180 degrees, less than 175 degrees, less than 170 degrees, less than 165 degrees, less than 160 degrees, less than 155 degrees, less than 150 degrees, less than 145 degrees, less than 140 degrees, less than 135 degrees, less than 130 degrees, less than 125 degrees, less than 120 degrees, less than 115 degrees, less than 110 degrees, less than 105 degrees, or less than 100 degrees, and/or taper angles of greater than 90 degrees, greater than 95 degrees, greater than 100 degrees, greater than 105 degrees, greater than 110 degrees, greater than 115 degrees, greater than 120 degrees, greater than 125 degrees, greater than 130 degrees, greater than 135 degrees, greater than 140 degrees, or greater than 145 degrees.

As shown in FIGS. 9 and 12 and discussed herein, taper angle 290 includes a non-zero taper angle. Thus, first extension surface 287 is not parallel to first wedge surface 279. Similarly, second extension surface 289 is not parallel to second wedge surface 280.

As perhaps best shown in FIG. 10, conductive probes 250 according to the present disclosure may be constructed such that a line of intersection between first wedge surface 279 and first extension surface 287 and/or a line of intersection between second wedge surface 280 and second extension surface 289 may be parallel, or at least substantially parallel, to first body surface 206 of flexible dielectric body 204 when the flexible dielectric body is in an undeformed state. Similarly, longitudinal axis 276 of elongate apex 274 may be parallel, or at least substantially parallel, to the first body surface when the flexible dielectric body is in the undeformed state.

Alternatively, and as perhaps best shown in FIG. 11, conductive probes 250 according to the present disclosure also may be constructed such that longitudinal axis 276 of elongate apex 274 is at a skew apex angle 275 with respect to first body surface 206 of flexible dielectric body 204 when the flexible dielectric body is in the undeformed state. Illustrative, non-exclusive examples of skew apex angles 275 according to the present disclosure include skew apex angles of less than 45 degrees, less than 40 degrees, less than 35 degrees, less than 30 degrees, less than 25 degrees, less than 20 degrees, less than 15 degrees, less than 10 degrees, or less than 5 degrees, and/or skew apex angles of greater than 1 degree, greater than 2 degrees, greater than 3 degrees, greater than 4 degrees, greater than 5 degrees, greater than 10 degrees, or greater than 15 degrees.

Elongate apex 274 may include any suitable length when measured along longitudinal axis 276 thereof. As illustrative, non-exclusive examples the length of the elongate apex may be at least 25 micrometers (um), at least 30 um, at least 35 um, at least 40 um, at least 45 um, at least 50 um, at least 55 um, at least 60 um, or at least 65 um. Additionally or alternatively, the length of the elongate apex may be less than 105 um, less than 100 um, less than 95 um, less than 90 um, less than 85 um, less than 80 um, less than 75 um, less than 70 um, or less than 65 um.

Additionally or alternatively, the elongate apex may be configured to form the electrical connection with a contact surface on the device under test that includes a characteristic dimension, such as a characteristic diameter, equivalent diameter, and/or maximum dimension of the contact surface, and the length of the elongate apex may be selected based, at least in part, on the characteristic dimension of the contact surface. As illustrative, non-exclusive examples, the elongate apex may be less than 150%, less than 140%, less than 130%, less than 120%, less than 110%, less than 100%, less than 90%, less than 80%, less than 70%, or less than 60% of the characteristic dimension of the contact surface, and/or greater than 15%, greater than 20%, greater than 25%, greater than 30%, greater than 35%, greater than 40%, greater than 45%, greater than 50%, greater than 55%, or greater than 60% of the characteristic dimension of the contact surface.

As perhaps best shown in FIG. 10, extension region 286 of conductive probes 250 according to the present disclosure also may include a third extension surface 296 and a fourth extension surface 298, each of which may extend from probe base 260 to elongate apex 274, with elongate apex 274 extending between third extension surface 296 and fourth extension surface 298.

Third extension surface 296 and/or fourth extension surface 298 may be perpendicular, or at least substantially perpendicular, to first extension surface 287 and/or second extension surface 289 and an angle of intersection between the third extension surface and the elongate apex and/or between the fourth extension surface and the elongate apex may define a second taper angle 294. Illustrative, non-exclusive examples of second taper angles 294 according to the present disclosure include second taper angles of less than 180 degrees, less than 175 degrees, less than 170 degrees, less than 165 degrees, less than 160 degrees, less than 155 degrees, less than 150 degrees, less than 145 degrees, less than 140 degrees, less than 135 degrees, less than 130 degrees, less than 125 degrees, less than 120 degrees, less than 115 degrees, less than 110 degrees, less than 105 degrees, or less than 100 degrees, and/or second taper angles of greater than 90 degrees, greater than 95 degrees, greater than 100 degrees, greater than 105 degrees, greater than 110 degrees, greater than 115 degrees, greater than 120 degrees, greater than 125 degrees, greater than 130 degrees, greater than 135 degrees, greater than 140 degrees, or greater than 145 degrees.

The systems, probe head assemblies, components thereof, and methods disclosed herein have been discussed in the context of a test system that includes a single probe head assembly with a single contacting assembly that is configured to form a plurality of connections with and/or to test a single DUT. It is within the scope of the present disclosure that, subsequent to testing a first DUT of a plurality of DUTs that may be present on a substrate, the systems, probe head assemblies, components thereof, and/or methods may be utilized to test a second, or subsequent, DUT of the plurality of DUTs. This may include testing a selected portion, a majority, and/or all of the DUTs that may be present on the substrate.

Additionally or alternatively, it is also within the scope of the present disclosure that the test system may include a plurality of probe head assemblies that is configured to simultaneously, or concurrently, test a plurality of devices under test. Similarly, the probe head assembly may include a plurality of contacting assemblies that are configured to simultaneously contact a plurality of DUTs and/or a single contacting assembly may be configured to simultaneously contact the plurality of DUTs. When the systems and methods are utilized to simultaneously contact the plurality of DUTs, the systems and methods may be configured to align the contacting assembly with a respective DUT of the plurality of DUTs independently from a remainder of the plurality of DUTs. Thus, test systems, probe head assemblies, and/or contacting assemblies according to the present disclosure may be utilized for series, parallel, and/or series-parallel testing of the plurality of DUTs that may be present on the substrate.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe head assembly for testing a device under test, the probe head assembly comprising:
a space transformer;
a contacting assembly that includes a flexible dielectric body with a first body surface and an opposed second body surface, wherein the contacting assembly includes a plurality of conductive probes, and further wherein the plurality of conductive probes is configured to form a plurality of test contacts with the device under test and to convey a plurality of test signals between the first body surface and the opposed second body surface;
means for spatially separating the space transformer from the contacting assembly; and
means for conveying the plurality of test signals between the plurality of conductive probes and the space transformer.

A2. The probe head assembly of paragraph A1, wherein the means for spatially separating includes a riser.

A3. The probe head assembly of any of paragraphs A1-A2, wherein the means for conveying includes a/the riser.

B1. A probe head assembly for testing a device under test, the probe head assembly comprising:
a space transformer;
a contacting assembly that includes a flexible dielectric body with a first body surface and an opposed second body surface, wherein the contacting assembly includes a plurality of conductive probes, and further wherein the plurality of conductive probes is configured to form a plurality of test contacts with the device under test and to convey a plurality of test signals between the first body surface and the opposed second body surface; and
a riser configured to separate the space transformer from the contacting assembly and to convey the plurality of test signals between the plurality of conductive probes and the space transformer.

C1. The probe head assembly of any of paragraphs A2-B1, wherein the riser includes a planar riser.

C2. The probe head assembly of any of paragraphs A2-C1, wherein the riser includes a first riser surface and an opposed, second riser surface.

C3. The probe head assembly of any of paragraphs A2-C2, wherein a thickness of the riser is at least one of at least 0.025 mm, at least 0.5 mm, at least 0.75 mm, at least 0.1 mm, at least 0.2 mm, at least 0.3 mm, at least 0.4 mm, at least 0.5 mm, at least 0.6 mm, at least 0.7 mm, at least 0.8 mm, at least 0.9 mm, or at least 1 mm and/or wherein the thickness of the riser is less than 3 mm, less than 2.75 mm, less than 2.5 mm, less than 2.25 mm, less than 2 mm, less than 1.75 mm, less than 1.5 mm, less than 1.25 mm, less than 1 mm, less than 0.9 mm, less than 0.8 mm, less than 0.7 mm, less than 0.6 mm, or less than 0.5 mm.

C4. The probe head assembly of any of paragraphs A2-C3, wherein the riser includes a plurality of test signal conduits that are configured to convey the plurality of test signals between the plurality of conductive probes and the space transformer.

C5. The probe head assembly of paragraph C4, wherein the plurality of test signal conduits includes a plurality of first ends proximal to a/the first riser surface and a plurality of second ends proximal to a/the second riser surface, and optionally wherein an average spacing between the plurality of first ends is at least one of substantially similar to and similar to an average spacing between the plurality of second ends.

C6. The probe head assembly of any of paragraphs C4-C5, wherein the plurality of test signal conduits includes at least one of a plurality of metallic conduits, a plurality of electrical conduits, a plurality of electrically conductive conduits, a plurality of optical conduits, a plurality of optically conductive conduits, a plurality of waveguides, and a plurality of electromagnetic radiation conduits.

C7. The probe head assembly of any of paragraphs A2-C6, wherein the riser further includes a plurality of first riser surface contact pads and a plurality of second riser surface contact pads, and further wherein a selected one of a/the plurality of test signal conduits of the riser is in conductive communication with a selected one of the plurality of first riser surface contact pads and a selected one of the plurality of second riser surface contact pads.

C8. The probe head assembly of paragraph C7, wherein a pitch of the plurality of first riser surface contact pads is similar to a pitch of the plurality of second riser surface contact pads.

C9. The probe head assembly of any of paragraphs A2-C8, wherein the riser is not a space transforming device.

C10. The probe head assembly of any of paragraphs A2-C9, wherein the riser is configured to convey the plurality of test signals between the plurality of conductive probes and the space transformer on a plurality of linear conduction paths.

C11. The probe head assembly of any of paragraphs A2-C10, wherein the riser includes a rigid riser.

C12. The probe head assembly of any of paragraphs A2-C10, wherein the riser is a resilient riser that includes a resilient dielectric riser body, and optionally wherein the resilient dielectric riser body at least one of includes silicone, is formed of silicone, and is silicone.

C13. The probe head assembly of any of paragraphs A2-C12, wherein the riser includes a composite riser assembly.

C14. The probe head assembly of paragraph C13, wherein the composite riser assembly includes at least a first riser and a second riser, optionally wherein the first riser is configured to convey the plurality of test signals between the plurality of conductive probes and the second riser, and further optionally wherein the second riser is configured to convey the plurality of test signals between the first riser and the space transformer.

C15. The probe head assembly of paragraph C14, wherein at least one of the first riser and the second riser includes at least one of a/the rigid riser and a/the resilient riser.

C16. The probe head assembly of paragraph C13, wherein the composite riser assembly includes a first riser, an intermediate riser, and a second riser, optionally wherein the first riser is configured to convey the plurality of test signals between the plurality of conductive probes and the intermediate riser, optionally wherein the intermediate riser is configured to convey the plurality of test signals between the first riser and the second riser, and further optionally wherein the second riser is configured to convey the plurality of test signals between the intermediate riser and the space transformer.

C17. The probe head assembly of paragraph C16, wherein at least one of the first riser, the intermediate riser, and the second riser includes a/the resilient dielectric riser body and a plurality of conductive resilient riser conduits.

C18. The probe head assembly of paragraph C17, wherein the resilient dielectric riser body includes silicone.

C19. The probe head assembly of any of paragraphs C16-C18, wherein at least one of the first riser, the intermediate riser, and the second riser includes a rigid dielectric riser body and a plurality of conductive rigid riser conduits.

C20. The probe head assembly of any of paragraphs C16-C19, wherein the first riser includes a conductive probe-proximal surface, wherein the second riser includes a space transformer-proximal surface, and further wherein a plurality of conductive riser conduits conveys the plurality of test signals between the plurality of conductive probes and the space transformer.

C21. The probe head assembly of paragraph C20, wherein a space transformer-proximal end of the plurality of conductive riser conduits intersect the space transformer-proximal surface at a location that is substantially opposed to, or opposed to, a location where a conductive probe-proximal end of the plurality of conductive riser conduits intersects the conductive probe-proximal surface.

C22. The probe head assembly of any of paragraphs C20-C21, wherein the plurality of conductive riser conduits passes through at least one of the first riser, the intermediate riser, and the second riser at a skew angle relative to a surface normal direction of at least one of the conductive probe-proximal surface and the space transformer-proximal surface.

C23. The probe head assembly of any of paragraphs C16-C22, wherein the riser includes a plurality of intermediate layers.

C24. The probe head assembly of any of paragraphs A2-C23, wherein at least one of the space transformer, the riser, and the contacting assembly includes one or more surface-mounted electronic components.

C25. The probe head assembly of paragraph C24, wherein the riser is configured to provide clearance for the one or more surface-mounted electronic components, and optionally wherein the riser is configured to define an air gap between the one or more surface-mounted electronic components and at least one of the space transformer, the contacting assembly, and the riser.

C26. The probe head assembly of paragraph C25, wherein the riser is configured to prevent physical contact between the one or more surface-mounted electronic components and a portion of at least one of the space transformer, the contacting assembly, and the riser that is not configured to physically contact the one or more surface-mounted electronic components.

C27. The probe head assembly of any of paragraphs C24-C26, wherein the riser is configured to prevent physical contact between the device under test and a portion of the probe head assembly that does not include the plurality of conductive probes, and optionally wherein the riser is configured to define an/the air gap between the device under test and the portion of the probe had assembly that does not include the plurality of conductive probes.

C28. The probe head assembly of any of paragraphs C24-C27, wherein the one or more surface-mounted electronic components includes at least one of an active electronic component, a passive electronic component, an electronic filter, a capacitor, an inductor, a resistor, a transistor, and an integrated circuit.

C29. The probe head assembly of any of paragraphs A2-C28, wherein the riser is fabricated separately from the space transformer.

C30. The probe head assembly of any of paragraphs A2-C29, wherein the riser is operatively attached to the space transformer, and optionally wherein the riser is at least one of adhered and soldered to the space transformer.

C31. The probe head assembly of any of paragraphs A2-C30, wherein the riser is in contact with the contacting assembly, and optionally wherein the contact includes at least one of mechanical contact, conductive contact, electrically conductive contact, and optically conductive contact.

C32. The probe head assembly of paragraph C31, wherein the contacting assembly is tensioned across a surface of the riser, and further wherein the tension generates a restoring force that maintains the contacting assembly in contact with the surface of the riser.

C33. The probe head assembly of any of paragraphs A2-C32, wherein the riser is at least one of not operatively attached to the contacting assembly and configured to be separated from the contacting assembly.

C34. The probe head assembly of any of paragraphs A2-C33, wherein the probe head assembly is configured to convey the plurality of test signals between the space transformer and the plurality of conductive probes without transferring any of the plurality of test signals along a conductive trace that is present on the flexible dielectric body of the contacting assembly.

C35. The probe head assembly of any of paragraphs A2-C34, wherein the probe head assembly is configured to convey an external test signal to a selected conductive probe of the contacting assembly without the external test signal passing through at least one of the riser and the space transformer.

C36. The probe head assembly of any of paragraphs A2-C35, wherein the probe head assembly includes an external test signal lead, and further wherein the external test signal lead is configured to provide an/the external test signal to a/the selected conductive probe of the contacting assembly without the external test signal passing through at least one of the riser and the space transformer.

C37. The probe head assembly of paragraph C36, wherein the external test signal lead includes at least one of a conductive trace that is external to at least one of the riser and the space transformer and a conductive trace that is present on the flexible dielectric body of the contacting assembly.

C38. The probe head assembly of any of paragraphs A1-C37, wherein the plurality of test signals includes at least one of an electrical signal, an optical signal, an electromagnetic signal, electromagnetic radiation, an electric field, and a magnetic field.

C39. The probe head assembly of any of paragraphs A1-C38, wherein the plurality of test signals includes a plurality of discrete test signals.

C40. The probe head assembly of any of paragraphs A1-C39, wherein the probe head assembly includes a plurality of contacting assemblies configured to test a plurality of devices under test, and optionally wherein the plurality of contacting assemblies is configured to test the plurality of devices under test at least partially concurrently.

C41. The probe head assembly of paragraph C40, wherein each of the plurality of contacting assemblies is associated with at least one of a respective space transformer and a respective riser.

C42. The probe head assembly of any of paragraphs C40-C41, wherein at least a portion of the plurality of contacting assemblies is configured to be aligned with a respective device under test independent of a remainder of the plurality of contacting assemblies.

C43. The probe head assembly of any of paragraphs A1-C42, wherein the space transformer includes a planar space transformer.

C44. The probe head assembly of any of paragraphs A1-C43, wherein the space transformer includes a wide-pitch surface with a plurality of wide-pitch contact pads and an opposed narrow-pitch surface with a plurality of narrow-pitch contact pads, and further wherein an average spacing between the plurality of wide-pitch contact pads is greater than an average spacing between the plurality of narrow-pitch contact pads.

C45. The probe head assembly of any of paragraphs A1-C44, wherein the space transformer includes at least one of a printed circuit board, an application-specific space transformer, a customer-supplied space transformer, and an integrated circuit package.

C46. The probe head assembly of any of paragraphs A1-C45, wherein the contacting assembly includes a membrane probe assembly.

C47. The probe head assembly of any of paragraphs A1-C46, wherein the contacting assembly is operatively attached to a frame configured to locate the contacting assembly within the probe head assembly, and optionally wherein the contacting assembly includes the frame.

C48. The probe head assembly of paragraph C47, wherein the frame is configured to tension the flexible dielectric body across a/the surface of a/the riser to maintain the flexible dielectric body in a stretched state when the frame is mounted in the probe head assembly, and optionally wherein the flexible dielectric body extends past the surface of the riser and to the frame.

C49. The probe head assembly of any of paragraphs C47-C48, wherein the frame is configured to mount to the probe head assembly from a side of the probe head assembly that faces the device under test during testing of the device under test.

C50. The probe head assembly of any of paragraphs A1-C49, wherein the device under test includes at least one of an electronic device, an optical device, and an optoelectronic device.

C51. The probe head assembly of any of paragraphs A1-C50, wherein the device under test is fabricated on a substrate that includes a/the plurality of devices under test, and further wherein the probe head assembly is configured to test at least a portion of the plurality of devices under test that are present on the substrate at least one of prior to singulation and after singulation of the plurality of devices under test.

C52. The probe head assembly of paragraph C51, wherein the substrate includes at least one of a semiconductor wafer, a silicon wafer, a gallium arsenide wafer, and a III-V semiconductor wafer.

C53. The probe head assembly of any of paragraphs A1-C52, wherein the probe head assembly further includes a space transformer riser that is located on a side of the space transformer that is opposed to the contacting assembly.

C54. The probe head assembly of any of paragraphs A1-C53, wherein the probe head assembly further includes a probe head frame, and optionally wherein the space transformer riser is operatively attached to the probe head frame.

C55. The probe head assembly of paragraph C54, wherein the probe head frame is operatively attached to a/the frame configured to locate the contacting assembly within the probe head assembly.

C56. The probe head assembly of any of paragraphs A1-C55, wherein the probe head assembly further includes a wide pitch interposer, optionally wherein the wide pitch interposer is located on a/the side of the space transformer that is opposed to the contacting assembly, and further optionally wherein the wide pitch interposer is located on a side of a/the space transformer riser that is opposed to the contacting assembly.

C57. The probe head assembly of any of paragraphs A1-C56, wherein the probe head assembly further includes a printed circuit board, optionally wherein the printed circuit board is located on a/the side of the space transformer that is opposed to the contacting assembly, and further optionally wherein the printed circuit board is located on a side of a/the wide pitch interposer that is opposed to the contacting assembly.

C58. The probe head assembly of any of paragraphs A1-C57, wherein the probe head assembly further includes a stiffener, optionally wherein the stiffener is located on a/the side of the space transformer that is opposed to the contacting assembly, further optionally wherein the stiffener is located on a side of a/the printed circuit board that is opposite to the contacting assembly, and further optionally wherein a/the probe head frame is mounted to the stiffener.

C59. The probe head assembly of any of paragraphs A1-C58, wherein the probe head assembly further includes a flexure, wherein the flexure is configured to limit a contact force that is applied to the device under test by the probe head assembly.

C60. The probe head assembly of paragraph C59, wherein the flexure is located on a/the side of the space transformer that is opposed to the contacting assembly, and optionally wherein the flexure is located between a/the printed circuit board and the space transformer.

C61. The probe head assembly of any of paragraphs C59-C60, wherein the flexure includes at least one of a resilient material, a resilient material with included conductive flexure conduits, and a buckling beam.

D1. A test system for testing a device under test, the test system comprising:
the probe head assembly of any of paragraphs A1-C57; and
a chuck configured to locate the device under test with respect to the probe head assembly.

D2. The test system of paragraph D1, wherein the test system further includes a signal generator configured to generate an input signal, wherein the input signal forms a first portion of the plurality of test signals.

D3. The test system of any of paragraphs D1-D2, wherein the test system further includes a signal analyzer configured to receive an output signal, wherein the output signal forms a second portion of the plurality of test signals.

E1. A conductive probe configured to form an electrical connection with a device under test, the conductive probe comprising:
a probe base configured to operatively attach to a flexible dielectric body of a contacting assembly that includes the conductive probe; and
a probe tip that extends from the probe base and is configured to project from a surface of the flexible dielectric body and to electrically contact the device under test, wherein the probe tip includes:

an elongate apex configured to penetrate a contacted portion of the device under test;
a wedge-shaped region that includes the elongate apex and defines a wedge angle; and
an extension region that tapers from the probe base to the wedge-shaped region and defines a taper angle.

E2. The conductive probe of paragraph E1, wherein the wedge-shaped region includes a first wedge surface and a second wedge surface, wherein the wedge angle is defined by an angle of intersection between a plane that is parallel to the first wedge surface with a plane that is parallel to the second wedge surface.

E3. The conductive probe of any of paragraphs E1-E2, wherein a longitudinal axis of the elongate apex at least one of defines a line of intersection between the first wedge surface and the second wedge surface, is coextensive with the line of intersection between the first wedge surface and the second wedge surface, and is parallel to the line of intersection between the first wedge surface and the second wedge surface.

E4. The conductive probe of any of paragraphs E1-E3, wherein the wedge angle is less than 150 degrees, less than 140 degrees, less than 130 degrees, less than 120 degrees, less than 110 degrees, less than 100 degrees, or less than 90 degrees, and for wherein the wedge angle is greater than 70 degrees, greater than 80 degrees, greater than 90 degrees, greater than 100 degrees, greater than 110 degrees, greater than 120 degrees, or greater than 130 degrees.

E5. The conductive probe of any of paragraphs E1-E4, wherein the extension region includes a first extension surface that extends between the probe base and a/the first wedge surface and a second extension surface that extends between the probe base and a/the second wedge surface, and further wherein the taper angle is defined by an angle of intersection between at least one, and optionally both, of (1) the first extension surface and the first wedge surface and (2) the second extension surface and the second wedge surface.

E6. The conductive probe of any of paragraphs E1-E5, wherein the taper angle is at least one of (1) less than 180 degrees, less than 175 degrees, less than 170 degrees, less than 165 degrees, less than 160 degrees, less than 155 degrees, less than 150 degrees, less than 145 degrees, less than 140 degrees, less than 135 degrees, less than 130 degrees, less than 125 degrees, less than 120 degrees, less than 115 degrees, less than 110 degrees, less than 105 degrees, or less than 100 degrees, and (2) greater than 90 degrees, greater than 95 degrees, greater than 100 degrees, greater than 105 degrees, greater than 110 degrees, greater than 115 degrees, greater than 120 degrees, greater than 125 degrees, greater than 130 degrees, greater than 135 degrees, greater than 140 degrees, or greater than 145 degrees.

E7. The conductive probe of any of paragraphs E5-E6, wherein a line of intersection between at least one, and optionally both, of (1) the first extension surface and the first wedge surface, and (2) the second extension surface and the second wedge surface is at least substantially parallel, or parallel, to the surface of the flexible dielectric body when the flexible dielectric body is in an undeformed configuration.

E8. The conductive probe of any of paragraphs E5-E6, wherein the first extension surface is not parallel to the first wedge surface, and further wherein the second extension surface is not parallel to the second wedge surface.

E9. The conductive probe of any of paragraphs E1-E8, wherein the conductive probe is symmetrical in at least one, and optionally two, dimensions.

E10. The conductive probe of any of paragraphs E5-E9, wherein the extension region further includes a third extension surface that extends between the probe base and the elongate apex, and a fourth extension surface that extends between the probe base and the elongate apex.

E11. The conductive probe of paragraph E10, wherein at least one, and optionally both, of the third extension surface and the fourth extension surface is perpendicular to at least one, and optionally both, of the first extension surface and the second extension surface.

E12. The conductive probe of any of paragraphs E10-E11, wherein the taper angle is a first taper angle, and further wherein a second taper angle is defined by an angle of intersection between at least one, and optionally both, of (1) the third extension surface and the elongate apex and (2) the fourth extension surface and the elongate apex.

E13. The conductive probe of paragraph E12, wherein the second taper angle is at least one of (1) less than 180 degrees, less than 175 degrees, less than 170 degrees, less than 165 degrees, less than 160 degrees, less than 155 degrees, less than 150 degrees, less than 145 degrees, less than 140 degrees, less than 135 degrees, less than 130 degrees, less than 125 degrees, less than 120 degrees, less than 115 degrees, less than 110 degrees, less than 105 degrees, or less than 100 degrees, and (2) greater than 90 degrees, greater than 95 degrees, greater than 100 degrees, greater than 105 degrees, greater than 110 degrees, greater than 115 degrees, greater than 120 degrees, greater than 125 degrees, greater than 130 degrees, greater than 135 degrees, greater than 140 degrees, or greater than 145 degrees.

E14. The conductive probe of any of paragraphs E10-E13, wherein the elongate apex extends between the third extension surface and the fourth extension surface.

E15. The conductive probe of any of paragraphs E1-E14, wherein a/the longitudinal axis of the elongate apex is configured to be parallel to the surface of the flexible dielectric body when the flexible dielectric body is in an/the undeformed configuration.

E16. The conductive probe of any of paragraphs E1-E15, wherein a/the longitudinal axis of the elongate apex is configured to be at a skew apex angle with respect to the surface of the flexible dielectric body when the flexible dielectric body is in an/the undeformed configuration.

E17. The conductive probe of paragraph E16, wherein the skew apex angle is at least one of (1) less than 45 degrees, less than 40 degrees, less than 35 degrees, less than 30 degrees, less than 25 degrees, less than 20 degrees, less than 15 degrees, less than 10 degrees, or less than 5 degrees, and (2) greater than 1 degree, greater than 2 degrees, greater than 3 degrees, greater than 4 degrees, greater than 5 degrees, greater than 10 degrees, or greater than 15 degrees.

E18. The conductive probe of any of paragraphs E1-E17, wherein the elongate apex includes a longitudinal length of at least one of (1) at least 25 micrometers (um), at least 30 um, at least 35 um, at least 40 um, at least 45 um, at least 50 um, at least 55 um, at least 60 um, or at least 65 um, and (2) less than 105 um, less than 100 um, less than 95 um, less than 90 um, less than 85 um, less than 80 um, less than 75 um, less than 70 um, or less than 65 um.

E19. The conductive probe of any of paragraphs E1-E18, wherein the conductive probe is configured to form the electrical connection with a contact surface that includes a characteristic dimension, wherein a/the longitudinal length of the elongate apex is at least one of (1) less than 150%, less than 140%, less than 130%, less than 120%, less than 110%, less than 100%, less than 90%, less than 80%, less than 70%, or less than 60% of the characteristic dimension of the contact surface, and (2) greater than 15%, greater than 20%, greater than 25%, greater than 30%, greater than 35%, greater than 40%, greater than 45%, greater than 50%, greater than 55%, or greater than 60% of the characteristic dimension of the contact surface, and optionally wherein the characteristic dimension includes at least one of a diameter, an equivalent diameter, and a maximum dimension of the contact surface.

E20. The conductive probe of any of paragraphs E1-E19, wherein the probe base includes a pair of spaced-apart, radially projecting ridges, and further wherein the ridges are configured to provide a surface area for an adhesive bond between the flexible dielectric body and the conductive probe.

F1. A contacting assembly for contacting a device under test, the contacting assembly comprising:
a frame that defines an aperture;
a flexible dielectric body that is operatively attached to the frame, is maintained in tension by the frame, and extends across the aperture;
a plurality of conductive probes that are operatively attached to the flexible dielectric body; and
means for maintaining an orientation of the plurality of conductive probes relative to respective test pads on the device under test at a plurality of different temperatures that includes at least a minimum temperature and a maximum temperature, wherein the minimum temperature and the maximum temperature define a threshold temperature range.

F2. The contacting assembly of paragraph F1, wherein the means for maintaining includes selecting a coefficient of thermal expansion of the frame to be within a threshold difference of a coefficient of thermal expansion of the device under test.

F3. The contacting assembly of any of paragraphs F1-F2, wherein the means for maintaining includes, or is, a means for preventing a loss of contact between the plurality of conductive probes and the respective test pads.

F4. A contacting assembly for contacting a device under test, the contacting assembly comprising:
a frame that defines an aperture, wherein a coefficient of thermal expansion of the frame is selected to be within a threshold difference of a coefficient of thermal expansion of the device under test;
a flexible dielectric body that is operatively attached to the frame, is maintained in tension by the frame, and extends across the aperture; and
a plurality of conductive probes that are operatively attached to the flexible dielectric body.

F5. The contacting assembly of any of paragraphs F1-F4, wherein an/the orientation of the plurality of conductive probes relative to respective test pads on the device under test is maintained at a/the plurality of different temperatures that include at least a/the minimum temperature and a/the maximum temperature by at least one of thermal expansion and thermal contraction of the frame, wherein the minimum temperature and the maximum temperature define a/the threshold temperature range.

F6. The contacting assembly of any of paragraphs F1-F5, wherein the frame is configured to maintain alignment of the plurality of conductive probes relative to a/the respective test pads on the device under test over a/the threshold temperature range by at least one of expanding and contracting at a frame thermal expansion rate that is comparable to a device under test thermal expansion rate.

F7. The contacting assembly of any of paragraphs F2-F6, wherein the threshold difference is less than 25%, less than 20%, less than 15%, less than 10%, less than 5%, less than 4%, less than 3%, less than 2%, less than 1%, less than 0.5%, less than 0.1%, substantially zero, or zero, and optionally wherein the frame and the device under test are constructed from the same material.

F8. The contacting assembly of any of paragraphs F1-F3 and F5-F7, wherein the threshold temperature range is at least 20 degrees C., at least 30 degrees C., at least 40 degrees C., at least 50 degrees C., at least 60 degrees C., at least 70 degrees C., at least 80 degrees C., at least 90 degrees C., at least 100 degrees C., at least 110 degrees C., at least 120 degrees C., at least 130 degrees C., at least 140 degrees C., at least 150 degrees C., at least 160 degrees C., at least 170 degrees C., or at least 180 degrees C.

F9. The contacting assembly of any of paragraphs F1-F3 and F5-F8, wherein the minimum temperature is less than 0 degrees C., less than 10 degrees C., less than 20 degrees C., less than 30 degrees C., less than 40 degrees C., less than 50 degrees C., less than 60 degrees C., or less than 70 degrees C.

F10. The contacting assembly of any of paragraphs F1-F3 and F5-F9, wherein the maximum temperature is greater than 90 degrees C., greater than 100 degrees C., greater than 110 degrees C., greater than 120 degrees C., greater than 130 degrees C., greater than 140 degrees C., greater than 150 degrees C., greater than 160 degrees C., greater than 170 degrees C., or greater than 180 degrees C.

F11. The contacting assembly of any of paragraphs F1-F10, wherein the contacting assembly is configured to be mounted in a probe head of a test system, and further wherein the frame is configured to stretch the flexible dielectric body across a surface of a riser to maintain a plurality of conductive contacts between the plurality of conductive probes and the riser during operation of the test system.

F12. The contacting assembly of paragraph F11, wherein the contacting assembly is configured to be mounted within the probe head from a side of the probe head that faces the device under test during testing of the device under test.

F13. The contacting assembly of paragraph F12, wherein the flexible dielectric body is configured to be tensioned across the riser.

F14. The contacting assembly of paragraph F13, wherein the riser separates the flexible dielectric body from a space transformer, and further wherein an upper surface of the frame does not extend past an upper surface of the space transformer.

F15. The contacting assembly of any of paragraphs F1-F14, wherein a/the coefficient of thermal expansion of the frame is greater than a coefficient of thermal expansion of the flexible dielectric body.

F16. The contacting assembly of any of paragraphs F1-F15, wherein the tension on the flexible dielectric body is sufficient to maintain the flexible dielectric body in tension by the frame throughout the threshold temperature range.

G1. The probe head assembly of any of paragraphs A1-C61 or the test system of any of paragraphs D1-D3, wherein the plurality of conductive probes includes the conductive probe of any of paragraphs E1-E20.

G2. The probe head assembly of any of paragraphs A1-C61 or the test system of any of paragraphs D1-D3, wherein the contacting assembly includes the contacting assembly of any of paragraphs F1-F16.

G3. The contacting assembly of any of paragraphs F1-F16, wherein the plurality of conductive probes includes the conductive probe of any of paragraphs E1-E20.

H1. A method of testing a device under test, the method comprising:
contacting the device under test with the probe head assembly of any of paragraphs A1-C61;
providing an input signal to the device under test; and
receiving an output signal from the device under test.

H2. A method of testing a device under test, the method comprising:

providing an input signal to the device under test and receiving an output signal from the device under test using the test system of any of paragraphs D1-D3.

H3. A method of maintaining an orientation of a plurality of conductive probes of a contacting assembly relative to respective test pads on a device under test over a threshold temperature range, the method comprising:

testing the device under test at one temperature that is, and optionally a plurality of temperatures that are, within the threshold temperature range using the contacting assembly of any of paragraphs F1-F16.

H4. The method of paragraph H3, wherein the method further includes mounting the contacting assembly on a probe head.

H5. The method of paragraph H4, wherein the mounting includes mounting the contacting assembly from a side of the probe head that is proximal to the device under test during testing of the device under test.

H6. The method of any of paragraphs H4-H5, wherein the mounting includes tenting a flexible dielectric body of the contacting assembly across a riser of the probe head assembly.

I1. The use of any of the probe head assemblies of any of paragraphs A1-C61, any of the test systems of any of paragraphs D1-D3, any of the conductive probes of any of paragraphs E1-E20, or any of the contacting assemblies of any of paragraphs F1-F16 to test a device under test, and optionally to at least one of functionally test, electrically test, and optically test the device under test.

I2. The use of any of the probe head assemblies of any of paragraphs A1-C61, any of the test systems of any of paragraphs D1-D3, any of the conductive probes of any of paragraphs E1-E20, or any of the contacting assemblies of any of paragraphs F1-F16 to form at least one of an electrical connection and an optical connection between a test system and a device under test.

I3. The use of at least one of a riser, a rigid riser, and a resilient riser to provide a plurality of at least one of electrical and optical connections between a space transformer and a contacting assembly.

I4. The use of a resilient riser to increase compliance of a probe head assembly.

INDUSTRIAL APPLICABILITY

The systems, assemblies, and methods disclosed herein are applicable to the device test industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A contacting assembly for contacting a device under test, the contacting assembly comprising:
    a frame that defines an aperture;
    a flexible dielectric body that is operatively attached to the frame and extends across the aperture; and
    a plurality of conductive probes that is operatively attached to the flexible dielectric body, wherein:
    (i) the contacting assembly is configured to be mounted in a probe head of a test system;
    (ii) the frame is configured to maintain a plurality of conductive contacts between the plurality of conductive probes and a riser of the probe head during operation of the test system;
    (iii) the riser separates the flexible dielectric body from a space transformer of the probe head; and
    (iv) an upper surface of the frame does not extend past an upper surface of the space transformer.

2. The contacting assembly of claim 1, wherein an orientation of the plurality of conductive probes relative to respective test pads on the device under test is maintained over a plurality of different temperatures, which include at least a minimum temperature and a maximum temperature, by at least one of thermal expansion and thermal contraction of the frame, wherein the minimum temperature and the maximum temperature define a threshold temperature range.

3. The contacting assembly of claim 2, wherein the threshold temperature range is at least 100 degrees C.

4. The contacting assembly of claim 1, wherein the frame is configured to maintain alignment of the plurality of conductive probes relative to respective test pads on the device under test over a threshold temperature range by at least one of expanding and contracting at a frame thermal expansion rate that is comparable to a device under test thermal expansion rate of the device under test.

5. The contacting assembly of claim 1, wherein the frame has a coefficient of thermal expansion that is selected to be within 10% of a coefficient of thermal expansion of the device under test.

6. The contacting assembly of claim 1, wherein the frame has a coefficient of thermal expansion that is selected to be within 1% of a coefficient of thermal expansion of the device under test.

7. The contacting assembly of claim 1, wherein the frame and the device under test are constructed from substantially the same material.

8. The contacting assembly of claim 1, wherein the frame is configured to stretch the flexible dielectric body across a surface of the riser to maintain the plurality of conductive contacts between the plurality of conductive probes and the riser.

9. The contacting assembly of claim 1, wherein the contacting assembly is mounted within the probe head from a side of the probe head that faces the device under test during testing of the device under test.

10. The contacting assembly of claim 1, wherein the flexible dielectric body is configured to be tensioned across the riser by the frame.

11. The contacting assembly of claim 1, wherein the frame has a coefficient of thermal expansion that is greater than a coefficient of thermal expansion of the flexible dielectric body.

12. The contacting assembly of claim 1, wherein the frame has a coefficient of thermal expansion that is selected to be within 25% of a coefficient of thermal expansion of the device under test.

13. The contacting assembly of claim 1, wherein the flexible dielectric body is maintained in tension by the frame.

14. The contacting assembly of claim 13, wherein the tension on the flexible dielectric body is sufficient to maintain the flexible dielectric body in tension by the frame throughout a threshold temperature range of at least 100 degrees C.

15. A probe head for testing a device under test, the probe head comprising:
- the contacting assembly of claim 1; and
- a space transformer, wherein the flexible dielectric body includes a first body surface and an opposed second body surface, wherein the plurality of conductive probes is configured to form a plurality of test contacts with the device under test and to convey a plurality of test signals between the first body surface and the opposed second body surface.

16. The probe head of claim 15, wherein the flexible dielectric body is stretched across the upper surface of the space transformer by the frame such that the plurality of conductive probes is maintained in contact with the space transformer during operation of the probe head.

17. The probe head of claim 15, wherein the riser extends between the space transformer and the contacting assembly and conveys the plurality of test signals between the space transformer and the contacting assembly.

18. The probe head of claim 17, wherein the flexible dielectric body is stretched across the surface of the riser by the frame such that the plurality of conductive probes is maintained in contact with the riser during operation of the probe head.

19. A test system for testing a device under test, the test system comprising:
- the probe head of claim 15;
- a chuck configured to locate the device under test with respect to the probe head;
- a signal generator configured to generate an input signal, wherein the input signal forms a first portion of the plurality of test signals; and
- a signal analyzer configured to receive an output signal, wherein the output signal forms a second portion of the plurality of test signals.

20. The test system of claim 19, wherein the contacting assembly is mounted within the probe head from a side of the probe head that faces the device under test during testing of the device under test.

21. The test system of claim 19, wherein the test system includes the device under test.

22. A probe head for testing a device under test, the probe head comprising:
- a space transformer;
- a contacting assembly that includes:
  (i) a frame that defines an aperture;
  (ii) a flexible dielectric body that is operatively attached to the frame and extends across the aperture, wherein the flexible dielectric body includes a first body surface and an opposed second body surface; and
  (iii) a plurality of conductive probes that is operatively attached to the flexible dielectric body, wherein the plurality of conductive probes forms a plurality of test contacts with the device under test during testing of the device under test and conveys a plurality of test signals between the first body surface and the opposed second body surface; and
- a riser that extends between the space transformer and the contacting assembly and conveys the plurality of test signals between the space transformer and the contacting assembly during testing of the device under test.

23. The probe head of claim 22, wherein an upper surface of the frame does not extend past an upper surface of the space transformer.

24. The probe head of claim 22, wherein the contacting assembly is mounted within the probe head from a side of the probe head that faces the device under test during testing of the device under test.

25. The probe head of claim 22, wherein the flexible dielectric body is tensioned across the riser by the frame.

26. The probe head of claim 22, wherein the frame maintains a plurality of conductive contacts between the plurality of conductive probes and the riser.

27. The probe head of claim 22, wherein the riser separates the flexible dielectric body from the space transformer.

28. A test system for testing a device under test, the test system comprising:
- the probe head of claim 22;
- a chuck configured to locate the device under test with respect to the probe head;
- a signal generator configured to generate an input signal, wherein the input signal forms a first portion of the plurality of test signals; and
- a signal analyzer configured to receive an output signal, wherein the output signal forms a second portion of the plurality of test signals.

* * * * *